United States Patent
Schrattenecker et al.

(10) Patent No.: US 11,837,797 B2
(45) Date of Patent: Dec. 5, 2023

(54) INTEGRATED MULTI-CHANNEL RF CIRCUIT WITH PHASE SENSING

(71) Applicant: Infineon Technologies AG, Neubiberg (DE)

(72) Inventors: Jochen O. Schrattenecker, Reichenthal (AT); Niels Christoffers, Vienna (AT); Vincenzo Fiore, Linz (AT); Bernhard Gstoettenbauer, Engerwitzdorf (AT); Helmut Kollmann, Linz (AT); Alexander Melzer, Neutillmitsch (AT); Alexander Onic, Linz (AT); Rainer Stuhlberger, Puchenau (AT); Mathias Zinnoecker, Linz (AT)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 17/412,694

(22) Filed: Aug. 26, 2021

(65) Prior Publication Data

US 2021/0391650 A1 Dec. 16, 2021

Related U.S. Application Data

(62) Division of application No. 16/244,712, filed on Jan. 10, 2019, now Pat. No. 11,158,944.

(30) Foreign Application Priority Data

Jan. 10, 2018 (DE) .......................... 102018100474.5
May 18, 2018 (DE) .......................... 102018112092.3

(51) Int. Cl.
  *H01Q 3/36* (2006.01)
  *G01S 7/35* (2006.01)
  (Continued)

(52) U.S. Cl.
  CPC ............... *H01Q 3/36* (2013.01); *G01S 7/032* (2013.01); *G01S 7/35* (2013.01); *G01S 7/4008* (2013.01);
  (Continued)

(58) Field of Classification Search
  CPC .......... G01S 13/88; G01S 7/40; G01S 7/4008; G01S 7/032; G01S 7/4069; G01S 7/4073; H01Q 3/36
  (Continued)

(56) References Cited

U.S. PATENT DOCUMENTS 3,649,909 A * 3/1972 Ort .................. G01S 7/4008
                                                324/76.23
3,745,568 A * 7/1973 Schindler ............ G01S 13/32
                                                342/111
(Continued)

*Primary Examiner* — Vladimir Magloire
*Assistant Examiner* — Michael W Justice
(74) *Attorney, Agent, or Firm* — Harrity & Harrity, LLP

(57) ABSTRACT

A circuit includes a radio frequency (RF) channel including an input node and an output node and being configured to receive an RF oscillator signal at the input node and to provide an RF output signal at the output node; a mixer configured to mix an RF reference signal and an RF test signal representative of the RF output signal to generate a mixer output signal; an analog-to-digital converter configured to sample the mixer output signal in order to provide a sequence of sampled values; and a control circuit configured to provide a sequence of phase offsets by phase-shifting at least one of the RF test signal and the RF reference signal using one or more phase shifters, calculate a spectral value from the sequence of sampled values; and calculate estimated phase information indicating a phase of the RF output signal based on the spectral value.

24 Claims, 11 Drawing Sheets

(51) Int. Cl.
- *G01S 7/40* (2006.01)
- *H03L 7/06* (2006.01)
- *G01S 13/02* (2006.01)
- *G01S 13/34* (2006.01)
- *G01S 7/03* (2006.01)
- *G01S 13/88* (2006.01)
- *G01S 13/931* (2020.01)
- *H04B 1/16* (2006.01)
- *H04B 1/10* (2006.01)
- *G01R 25/04* (2006.01)

(52) U.S. Cl.
CPC .......... *G01S 7/4017* (2013.01); *G01S 7/4026* (2013.01); *G01S 7/4073* (2021.05); *G01S 13/02* (2013.01); *G01S 13/343* (2013.01); *G01S 13/88* (2013.01); *H03L 7/06* (2013.01); *G01R 25/04* (2013.01); *G01S 7/4069* (2021.05); *G01S 13/931* (2013.01); *G01S 2013/0254* (2013.01); *H04B 1/10* (2013.01); *H04B 1/109* (2013.01); *H04B 1/1081* (2013.01); *H04B 1/1638* (2013.01)

(58) Field of Classification Search
USPC .................................................. 342/350, 173
See application file for complete search history.

(56) References Cited

U.S. PATENT DOCUMENTS

| | | | | |
|---|---|---|---|---|
| 3,883,870 A * | 5/1975 | Kunz | .................. | G01S 7/4052 342/174 |
| 4,520,361 A * | 5/1985 | Frazita | .................. | H01Q 3/267 342/372 |
| 4,860,014 A * | 8/1989 | Shores | .................. | G01S 13/325 342/195 |
| 5,013,979 A * | 5/1991 | Birleson | .................. | H01Q 3/22 342/372 |
| 5,187,486 A * | 2/1993 | Kolzer | .................. | H01Q 3/267 342/173 |
| 5,608,331 A * | 3/1997 | Newberg | .................. | G01R 29/26 324/76.71 |
| 6,052,420 A * | 4/2000 | Yeap | .................. | H04B 15/00 375/258 |
| 6,351,247 B1 * | 2/2002 | Linstrom | .................. | H01Q 3/46 342/368 |
| 6,393,372 B1 * | 5/2002 | Rzyski | .................. | G01R 29/26 702/69 |
| 6,693,931 B1 * | 2/2004 | Mendenhall | .................. | H05H 7/00 372/29.016 |
| 7,885,632 B2 * | 2/2011 | Wangsness | .................. | H04B 17/101 455/324 |
| 8,248,297 B1 * | 8/2012 | Baker | .................. | G01S 7/4052 342/174 |
| 8,325,794 B2 * | 12/2012 | Lin | .................. | H03D 3/009 455/226.1 |
| 8,823,583 B2 * | 9/2014 | Hasch | .................. | G01S 7/4008 342/194 |
| 9,007,259 B1 * | 4/2015 | Minassian | .................. | G01S 7/40 342/175 |
| 9,314,226 B2 * | 4/2016 | Hancock | .................. | G01S 15/8997 |
| 9,465,001 B2 * | 10/2016 | Stanley | .................. | G01N 27/122 |
| 9,484,635 B2 * | 11/2016 | Poulson | .................. | H01Q 13/103 |
| 9,742,600 B2 * | 8/2017 | Nair | .................. | H04L 25/061 |
| 9,848,852 B2 * | 12/2017 | Hancock | .................. | A61B 8/445 |
| 9,921,296 B2 * | 3/2018 | Greenberg | .................. | G01S 13/282 |
| 9,998,170 B2 * | 6/2018 | Matsumura | .................. | H04B 1/0483 |
| 10,117,641 B2 * | 11/2018 | Hancock | .................. | A61B 8/445 |
| 10,243,640 B2 * | 3/2019 | Miyanaga | .................. | G01S 7/4008 |
| 10,256,517 B2 * | 4/2019 | Poulson | .................. | H01Q 13/10 |
| 10,274,585 B2 * | 4/2019 | Yagishita | .................. | G01S 7/4008 |
| 10,302,716 B2 * | 5/2019 | Reykowski | .................. | G01R 33/5673 |
| 10,768,278 B2 * | 9/2020 | Subburaj | .................. | G01S 13/34 |
| 2002/0140601 A1 * | 10/2002 | Sanada | .................. | H04B 1/30 342/368 |
| 2005/0190829 A1 * | 9/2005 | Lu | .................. | H04L 27/2067 375/224 |
| 2005/0219118 A1 * | 10/2005 | Kubo | .................. | H01Q 3/267 342/174 |
| 2008/0214129 A1 * | 9/2008 | Wangsness | .................. | H04B 17/15 455/115.1 |
| 2012/0064844 A1 * | 3/2012 | Miyashita | .................. | H03L 7/16 455/84 |
| 2012/0236906 A1 | 9/2012 | Binder et al. | | |
| 2012/0242538 A1 * | 9/2012 | Hasch | .................. | G01S 7/4008 342/194 |
| 2014/0192923 A1 * | 7/2014 | Matsuo | .................. | H01Q 3/28 375/296 |
| 2015/0009064 A1 * | 1/2015 | Waldschmidt | .................. | G01S 7/02 342/175 |
| 2015/0378010 A1 * | 12/2015 | Greenberg | .................. | G01S 13/282 342/173 |
| 2016/0006130 A1 * | 1/2016 | Poulson | .................. | H01Q 13/18 343/746 |
| 2016/0077030 A1 * | 3/2016 | Stanley | .................. | G01N 27/122 324/650 |
| 2016/0077196 A1 * | 3/2016 | Dehlink | .................. | G01R 31/2822 342/169 |
| 2016/0234046 A1 * | 8/2016 | Nair | .................. | H04L 25/061 |
| 2017/0025749 A1 * | 1/2017 | Frye | .................. | H01Q 21/0025 |
| 2017/0090014 A1 * | 3/2017 | Subburaj | .................. | G01S 7/4056 |
| 2017/0131394 A1 | 5/2017 | Roger et al. | | |
| 2017/0201019 A1 * | 7/2017 | Trotta | .................. | H01Q 3/2694 |
| 2017/0257137 A1 * | 9/2017 | Matsumura | .................. | H04B 1/16 |
| 2017/0285143 A1 * | 10/2017 | Yagishita | .................. | H03D 7/1441 |
| 2017/0288762 A1 * | 10/2017 | Miyanaga | .................. | G01S 7/4008 |
| 2017/0299672 A1 * | 10/2017 | Reykowski | .................. | G01R 33/5608 |
| 2018/0113196 A1 * | 4/2018 | Subburaj | .................. | G01S 13/34 |
| 2018/0115076 A1 * | 4/2018 | Poulson | .................. | H01Q 13/203 |
| 2018/0267144 A1 * | 9/2018 | Lin | .................. | G01S 7/42 |

\* cited by examiner $$s_{DC,0}[k] = \left( A_{TX01}\cos(\varphi_{TSG}[k]-\varphi_{TX01}-0) + A_{TX02}\cos(\varphi_{TSG}[k]-\varphi_{TX02}-0) + \ldots + A_{TXn}\cos(\varphi_{TSG}[k]-\varphi_{TXn}-0) \right)$$

$$s_{DC,1}[k] = \left( A_{TX01}\cos(\varphi_{TSG}[k]-\varphi_{TX01}-0) + A_{TX02}\cos(\varphi_{TSG}[k]-\varphi_{TX02}-\pi) + \ldots + A_{TXn}\cos(\varphi_{TSG}[k]-\varphi_{TXn}-\pi) \right)$$

$$s_{DC,2}[k] = \left( A_{TX01}\cos(\varphi_{TSG}[k]-\varphi_{TX01}-\pi) + A_{TX02}\cos(\varphi_{TSG}[k]-\varphi_{TX02}-0) + \ldots + A_{TXn}\cos(\varphi_{TSG}[k]-\varphi_{TXn}-\pi) \right)$$

$$\vdots$$

$$s_{DC,n}[k] = \left( A_{TX01}\cos(\varphi_{TSG}[k]-\varphi_{TX01}-\pi) + A_{TX02}\cos(\varphi_{TSG}[k]-\varphi_{TX02}-\pi) + \ldots + A_{TXn}\cos(\varphi_{TSG}[k]-\varphi_{TXn}-0) \right)$$

Fig. 10A $$M_{01}[k] = \left( s_{DC,0}[k] + s_{DC,1}[k] \right) = A_{TX01}\cos(\varphi_{TSG}[k]-\varphi_{TX01})$$

$$M_{02}[k] = \left( s_{DC,0}[k] + s_{DC,2}[k] \right) = A_{TX02}\cos(\varphi_{TSG}[k]-\varphi_{TX02})$$

$$\vdots$$

$$M_{0n}[k] = \left( s_{DC,0}[k] + s_{DC,n}[k] \right) = A_{TX02}\cos(\varphi_{TSG}[k]-\varphi_{TXn})$$

Fig. 10B $$s_{DC,0}[k] = \Big( A_{TX01}\cos(\varphi_{TSG}[k]-\varphi_{TX01}-0) + A_{TX02}\cos(\varphi_{TSG}[k]-\varphi_{TX02}-0) + \ldots + A_{TXn}\cos(\varphi_{TSG}[k]-\varphi_{TXn}-0) \Big)$$

$$s_{DC,1}[k] = \Big( A_{TX01}\cos(\varphi_{TSG}[k]-\varphi_{TX01}-\pi) + A_{TX02}\cos(\varphi_{TSG}[k]-\varphi_{TX02}-0) + \ldots + A_{TXn}\cos(\varphi_{TSG}[k]-\varphi_{TXn}-0) \Big)$$

$$s_{DC,2}[k] = \Big( A_{TX01}\cos(\varphi_{TSG}[k]-\varphi_{TX01}-0) + A_{TX02}\cos(\varphi_{TSG}[k]-\varphi_{TX02}-\pi) + \ldots + A_{TXn}\cos(\varphi_{TSG}[k]-\varphi_{TXn}-0) \Big)$$

$$\vdots$$

$$s_{DCn}[k] = \Big( A_{TX01}\cos(\varphi_{TSG}[k]-\varphi_{TX01}-0) + A_{TX02}\cos(\varphi_{TSG}[k]-\varphi_{TX02}-0) + \ldots + A_{TXn}\cos(\varphi_{TSG}[k]-\varphi_{TXn}-\pi) \Big)$$

Fig. 11A $$M_{01}[k] = \Big( s_{DC,0}[k] - s_{DC,1}[k] \Big) = A_{TX01}\cos(\varphi_{TSG}[k]-\varphi_{TX01})$$

$$M_{02}[k] = \Big( s_{DC,0}[k] - s_{DC,2}[k] \Big) = A_{TX02}\cos(\varphi_{TSG}[k]-\varphi_{TX02})$$

$$\vdots$$

$$M_{0n}[k] = \Big( s_{DC,0}[k] - s_{DC,n}[k] \Big) = A_{TX0n}\cos(\varphi_{TSG}[k]-\varphi_{TXn})$$

Fig. 11B

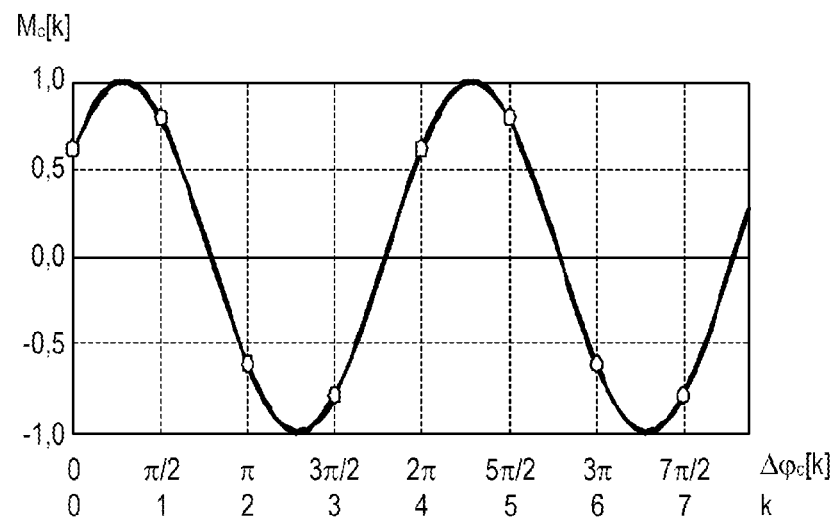
Fig. 15A
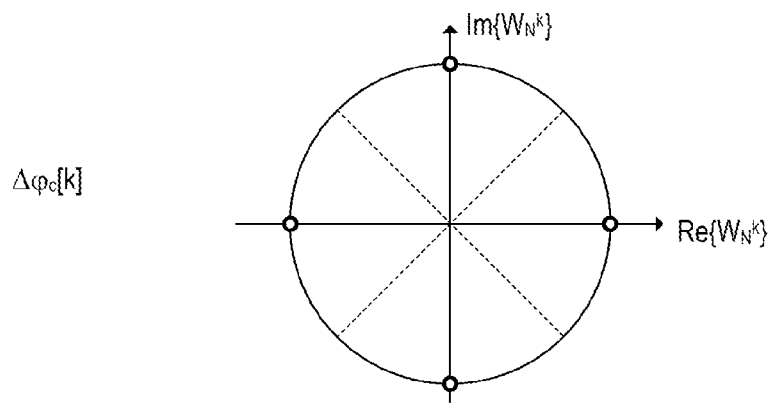
Fig. 15B
| k | 0 | 1 | 2 | 3 | 4 | 5 | 6 | 7 |
|---|---|---|---|---|---|---|---|---|
| $\Delta\varphi_c[k]$ | 0<br>0 | $\pi/2$<br>90° | $\pi$<br>180° | $3\pi/2$<br>270° | $2\pi$<br>360° | $5\pi/2$<br>450° | $3\pi$<br>540° | $7\pi/2$<br>630° |
| $\varphi_{TSG}[k]$ | 0<br>0 | $\pi/2$<br>90° | $\pi$<br>180° | $3\pi/2$<br>270° | $2\pi$<br>360° | $5\pi/2$<br>450° | $3\pi$<br>540° | $7\pi/2$<br>630° |
| $\Delta\varphi_{TXc}[k]$ | 0<br>0 | 0<br>0 | 0<br>0 | 0<br>0 | 0<br>0 | 0<br>0 | 0<br>0 | 0<br>0 |
Fig. 16

| k | 0 | 1 | 2 | 3 | 4 | 5 | 6 | 7 |
|---|---|---|---|---|---|---|---|---|
| $\Delta\varphi_c[k]$ | 0<br>0 | $\pi/2$<br>90° | $\pi$<br>180° | $3\pi/2$<br>270° | $2\pi$<br>360° | $5\pi/2$<br>450° | $3\pi$<br>540° | $7\pi/2$<br>630° |
| $\varphi_{TSG}[k]$ | 0<br>0 | $\pi/2$<br>90° | $\pi$<br>180° | $3\pi/2$<br>270° | $\pi/4$<br>45° | $3\pi/4$<br>135° | $5\pi/4$<br>225° | $7\pi/4$<br>315° |
| $\Delta\varphi_{TXc}[k]$ | 0<br>0 | 0<br>0 | 0<br>0 | 0<br>0 | $\pi/4$<br>45° | $\pi/4$<br>45° | $\pi/4$<br>45° | $\pi/4$<br>45° |

Fig. 17

INTEGRATED MULTI-CHANNEL RF CIRCUIT WITH PHASE SENSING

CROSS-REFERENCE TO RELATED APPLICATIONS

This application is a divisional of U.S. patent application Ser. No. 16/244,712 filed Jan. 10, 2019, which claims the benefit of German Patent Application No. 102018100474.5 filed Jan. 10, 2018 and German Patent Application No. 102018112092.3 filed on May 18, 2018, which are incorporated by reference as if fully set forth.

FIELD

The present disclosure relates to the field of radio frequency (RF circuits), particularly to a multi-channel RF circuit with multiple RF output channels.

BACKGROUND

Modern radar devices such as radar range and velocity sensors can be integrated in so-called monolithic microwave integrated circuits (MMICs). Radar sensors may be applied, for example, in the automotive sector, where they are used in so-called advanced driver assistance systems (ADAS) such as, for example, "adaptive cruise control" (ACC) or "radar cruise control" systems. Such systems may be used to automatically adjust the speed of an automobile so as to maintain a safe distance from other automobiles travelling ahead. However, RF circuits are also used in many other fields such as RF communication systems.

A radar MMIC (sometimes referred to as single chip radar) may incorporate all core functions of the RF frontend of a radar transceiver (e.g., local oscillator, power amplifiers, low-noise amplifiers (LNA), mixers, etc.), the analog pre-processing of the intermediate frequency (IF) or base band signals (e.g., filters, amplifiers, etc.), and the analog-to-digital conversion in one single package. The RF frontend usually includes multiple reception and transmission channels, particularly in applications in which beam steering techniques, phased antenna arrays, etc. are used. In radar applications, phased antenna arrays may be employed to sense the incidence angle of incoming RF radar signals (also referred to as "Direction of Arrival", DOA).

For example, when using a phased antenna array to radiate a radar signal, the phase shift and/or amplitude gain caused by each output channel needs to be known.

SUMMARY

A circuit is described herein. In accordance with one embodiment the circuit includes two or more RF channels, wherein each channel includes an input node, a phase shifter and an output node. Each channel is configured to receive an RF oscillator signal at the input node and to provide an RF output signal at the output node. The circuit further includes an RF combiner circuit that is coupled with the outputs of the RF channels and configured to generate a combined signal representing a combination of the RF output signals, and a monitor circuit that includes a mixer and is configured to receive and down-convert the combined signal using an RF reference signal. Thus, a mixer output signal is generated that depends on the phases of the RF output signals.

In accordance with a further embodiment the circuit includes one or more RF channels, wherein each channel includes an input node and an output node and is configured to receive an RF oscillator signal at the input node and to provide an RF output signal at the output node. The circuit further includes a monitor circuit that includes a mixer configured to mix an RF reference signal and an RF test signal, which represents the RF output signal, to generate a mixer output signal. An analog-to-digital converter is configured to sample the mixer output signal in order to provide a sequence of sampled values. A circuit is coupled to the analog-to-digital converter and configured to provide a sequence of phase offsets by phase-shifting at least one of the RF test signal and the RF reference signal using one or more phase shifters; to calculate a spectral value from the sequence of sampled values; and to calculate an estimated phase information indicating the phase of the RF output signal based on the spectral value.

Furthermore, a method is described herein. In accordance with one embodiment, the method includes receiving an RF oscillator signal and providing the RF oscillator signal to two or more RF channels of an RF circuit, wherein each channel generates an RF output signal based on the RF oscillator signal, and wherein each RF output signal has an amplitude and a phase. The method further includes a generation of a combined signal that represents a combination of the RF output signals and a down-conversion of the combined signal using an RF reference signal supplied to a mixer, wherein the mixer output signal is the down-converted signal. Moreover, the method includes processing the mixer output signal to obtain estimated values indicative of the amplitudes and/or phases of the RF output signals.

In accordance with a further embodiment, the method includes providing an RF test signal to a radar transmitter circuit; mixing an RF reference signal and an RF test signal, which represents an RF output signal of the radar transmitter circuit, to generate a mixer output signal. The method further includes repeatedly selecting a phase offset from a sequence of phase offsets and applying the selected phase offset by phase-shifting at least one of the RF test signal and the RF reference signal. The mixer output signal is sampled to generate a sequence of sampled values associated with the corresponding sequence of phase offsets, and a spectral value is calculated from the sequence of sampled values. Based on this spectral value, an estimated phase information indicating a phase of the RF output signal can be calculated.

Moreover, a radar microwave integrated circuit (MMIC) is described herein. In accordance with on embodiment, the radar MMIC includes two or more transmit channels, wherein each transmit channel includes an input node, a phase shifter and an output node. Each transmit channel is configured to receive an RF oscillator signal at the input node and to provide, as RF output signal, a frequency-modulated RF radar signal at the output node. The MMIC further includes an RF combiner circuit that is coupled with the outputs of the RF channels and configured to generate a combined signal representing a combination of the RF output signals, and a monitor circuit that includes a mixer and is configured to receive and down-convert the combined signal using an RF reference signal. Thus, a mixer output signal is generated that depends on the phases of the RF output signals.

BRIEF DESCRIPTION OF THE DRAWINGS

The invention can be better understood with reference to the following drawings and descriptions. The components in the figures are not necessarily to scale; instead emphasis is placed upon illustrating the principles of the invention.

Moreover, in the figures, like reference numerals designate corresponding parts. In the drawings:

FIGS. 10A and 10B show equations that illustrate one scheme, according to which phases of the RF output channels may be successively inverted during one measurement cycle in the RF circuit of FIG. 1.

FIGS. 11A and 11B show equations that illustrate an alternative scheme equivalent to the scheme of FIGS. 10A-10B, according to which the phases of the RF output channels may be successively inverted during one measurement cycle in the RF circuit of FIG. 1.

FIGS. 15A and 15B include diagrams illustrating a second example of a sequence of measured values and corresponding weight factors used for calculating a corresponding spectral value.

FIGS. 16 and 17 include tables with different phase shifter settings used when obtaining a sequence of measured values.

DETAILED DESCRIPTION

Embodiments of the present invention are discussed below in the context of a radar transmitter or transceiver. It should be noted, however, that the present invention may also be applied in applications different from radar such as, for example, RF transceivers of RF communication devices. In fact, almost any RF circuitry with multiple RF channels may take advantage of the concepts described herein.

Figure 1:
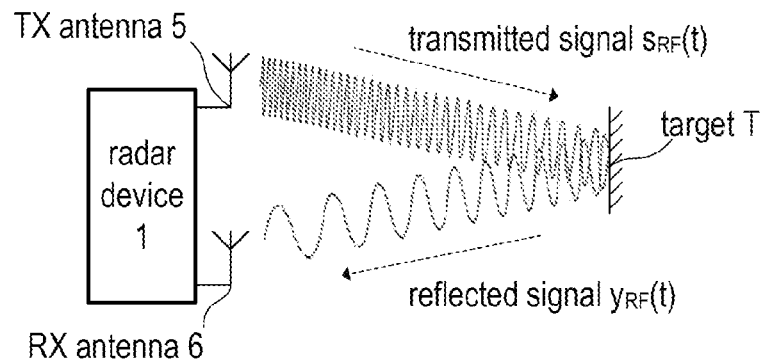
FIG. 1 is a drawing illustrating the operating principle of a frequency-modulated continuous-wave (FMCW) radar system for distance and/or velocity measurement.

FIG. 1 illustrates a conventional frequency-modulated continuous-wave (FMCW) radar system 1. In the present example, separate transmission (TX) and reception (RX) antennas 5 and 6, respectively, are used. However, it is noted that a single antenna can be used so that the transmission antenna and the reception antenna are physically the same (monostatic radar configuration). The transmission antenna continuously radiates an RF signal $s_{RF}(t)$, which is frequency-modulated, for example, by a periodic linear frequency ramp signal (also referred to as frequency sweep or chirp signal). The transmitted signal $s_{RF}(t)$ is back-scattered at a target T, which is located in the radar channel within the measurement range of the radar device. The back-scattered signal $y_{RF}(t)$ is received by the reception antenna 6. In the depicted example, the back-scattered signal is denoted as $y_{RF}(t)$.

Figure 2:
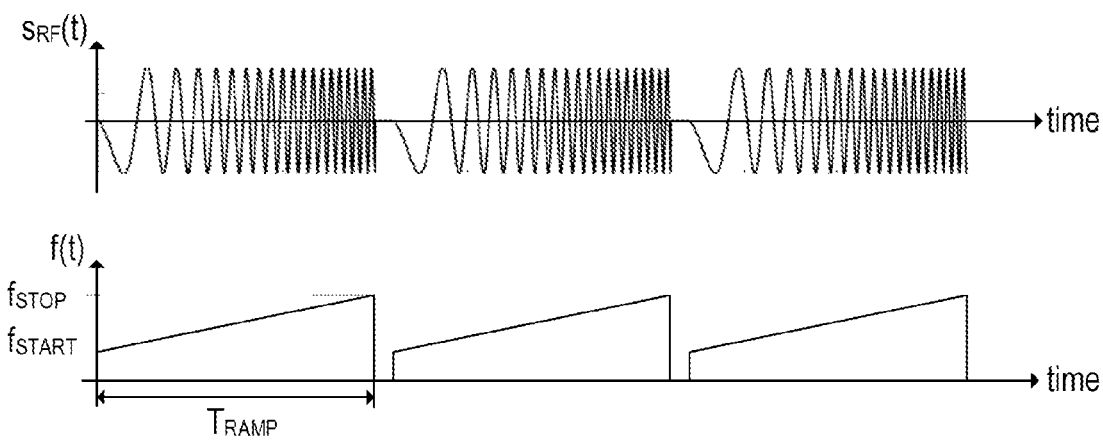
FIG. 2 includes two timing diagrams illustrating the frequency modulation of the radio frequency (RF) signal used in FMCW radar systems.

FIG. 2 illustrates the mentioned frequency-modulation of the signal $s_{RF}(t)$. As shown in the first diagram of FIG. 2, the signal $s_{RF}(t)$ may be composed of a series of "chirps", i.e., a sinusoidal waveform with increasing (up-chirp) or decreasing (down-chirp). In the present example, the instantaneous frequency f(t) of a chirp increases linearly from a start frequency $f_{START}$ to a stop frequency $f_{STOP}$ within a defined time span $T_{RAMP}$ (see second diagram of FIG. 2). Such a chirp is also referred to as a linear frequency ramp. Three identical linear frequency ramps are illustrated in FIG. 2. It is noted, however, that the parameters $f_{START}$, $f_{STOP}$, $T_{RAMP}$ as well as the pause between the individual frequency ramps may vary dependent on the actual implementation and use of the radar device 1. In practice, the frequency variation may be, for example, linear (linear chirp, frequency ramp), exponential (exponential chirp) or hyperbolic (hyperbolic chirp).

Figure 3:
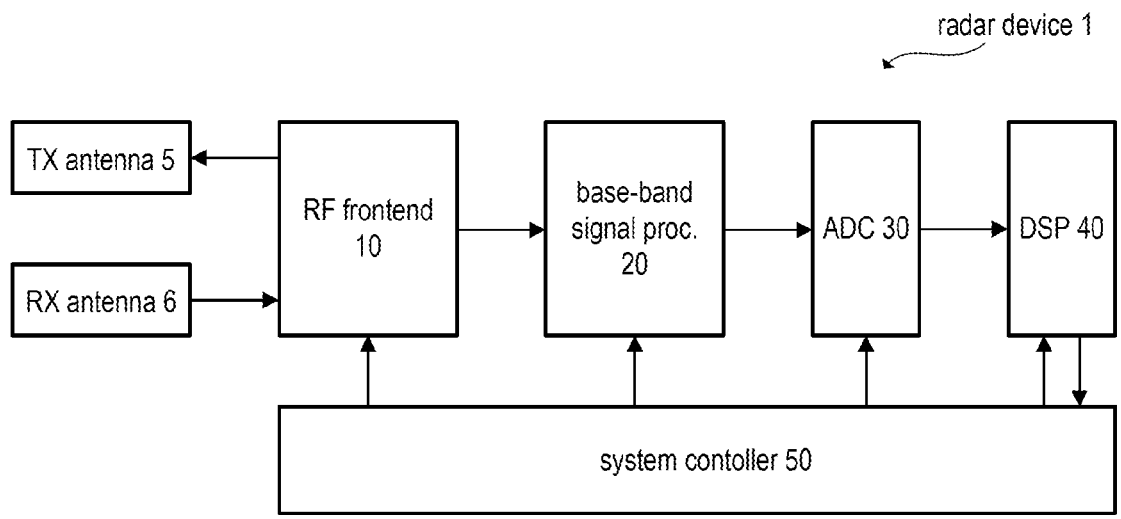
FIG. 3 is a block diagram illustrating the basic structure of an FMCW radar device.

FIG. 3 is a block diagram that illustrates an exemplary structure of a radar device 1 (radar sensor). It is noted that a similar structure may also be found in RF transceivers used in other applications such as, for example, in wireless communications systems. Accordingly, at least one transmission antenna 5 (TX antenna) and at least one reception antenna 6 (RX antenna) are connected to an RF frontend 10, which may be integrated in a monolithic microwave integrated circuit (MMIC). The RF frontend 10 may include all the circuit components needed for RF signal processing. Such circuit components may (but need not necessarily) include, for example, a local oscillator (LO), RF power amplifiers, low noise amplifiers (LNAs), directional couplers such as rat-race-couplers and circulators, and mixers for the down-conversion of RF signals (e.g., the received signal $y_{RF}(t)$, see FIG. 1) into the base-band or an intermediate frequency (IF) band. It is noted that antenna-arrays may be used instead of single antennas. The depicted example shows a bistatic (or pseudo-monostatic) radar system which has separate RX and TX antennas. In the case of a monostatic radar system, a single antenna or a single antenna array may be used to both receive and transmit electromagnetic (radar) signals. In this case, a directional coupler (e.g., a circulator) may be used to separate RF signals to be transmitted to the radar channel from RF signals received from the radar channel. In practice, radar systems often include several transmission (TX) and reception (RX) channels, which among others allows the measurement of the direction (DoA, direction of arrival), from which the radar echoes are received.

In the case of a frequency-modulated continuous-wave (FMCW) radar system, the transmitted RF signals radiated by the TX antenna 5 are in the range between approximately 20 GHz (e.g., 24 GHz) and 100 GHz (e.g., 77 GHz in automotive applications). As mentioned, the RF signal $y_{RF}$(t) received by the RX antenna 6 includes the radar echoes, i.e., the signal back-scattered at the so-called radar targets. The received RF signals $y_{RF}$(t) are down-converted into the base band (or IF band) and further processed in the base band using analog signal processing (see FIG. 3, base-band signal processing chain 20), which basically includes filtering and amplification of the base-band signal. The base-band signal is finally digitized using one or more analog-to-digital converters (ADC) 30 and further processed in the digital domain (see FIG. 3, digital signal processing chain implemented, e.g., in digital signal processor, DSP, 40). The overall system is controlled by a system controller 50, which may be at least partly implemented using a processor, such as a microcontroller executing appropriate firmware. The RF frontend 10 and the analog base-band signal processing chain 20 (and optionally the ADC 30) may be integrated in a single MMIC. However, in some applications, some components may also be distributed among two or more integrated circuits.

Figure 4:
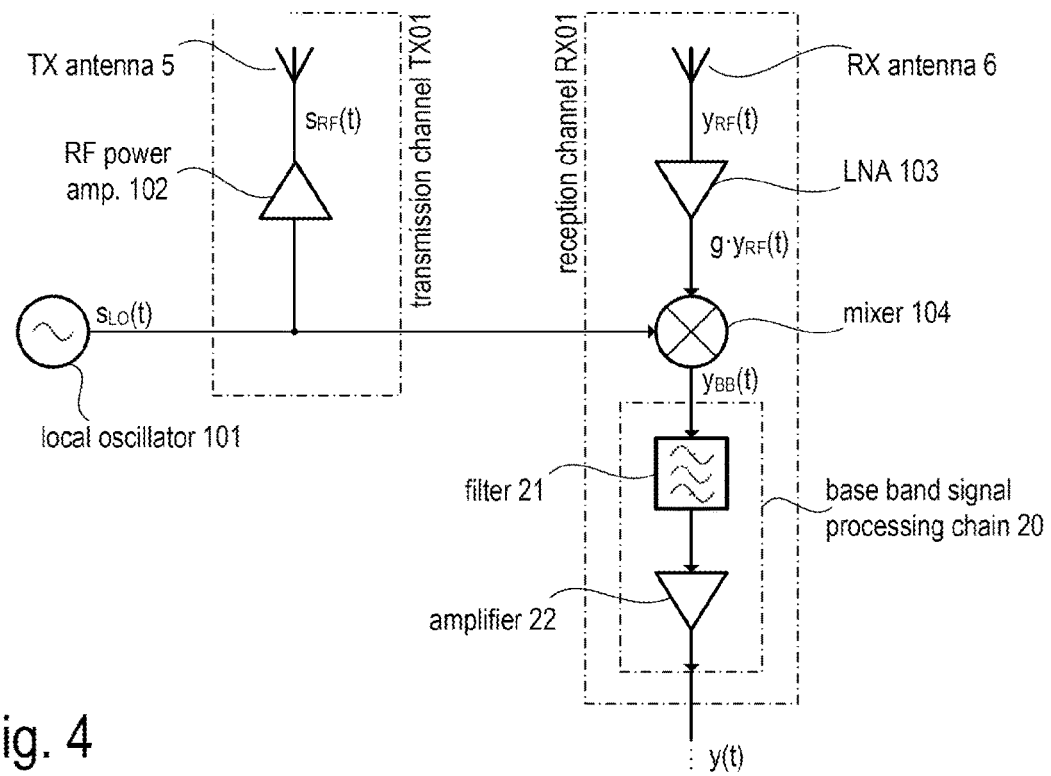
FIG. 4 is a circuit diagram illustrating one example of an analog RF frontend, which may be included in the FMCW radar device of FIG. 3.

FIG. 4 illustrated one exemplary implementation of the RF frontend 10, which may be included in the radar sensor shown in FIG. 3. It is noted that FIG. 4 is a simplified circuit diagram illustrating the basic structure of an RF frontend. Actual implementations, which may heavily depend on the application, are of course more complex and include several RX and/or TX channels. The RF frontend 10 includes a local oscillator 101 (LO) that generates a RF signal $s_{LO}$(t), which may be frequency-modulated as explained above with reference to FIG. 2. The signal $s_{LO}$(t) is also referred to as LO signal. In radar applications, the LO signal is usually in the SHF (Super High Frequency) or the EHF (Extremely High Frequency) band, e.g., between 76 GHz and 81 GHz in automotive applications.

The LO signal $s_{LO}$(t) is processed in the transmission signal path as well as in the reception signal path. The transmission signal $s_{RF}$(t) (outgoing radar signal), which is radiated by the TX antenna 5, is generated by amplifying the LO signal $s_{LO}$(t), e.g., using an RF power amplifier 102. The output of the amplifier 102 is coupled to the TX antenna 5. The received signal $y_{RF}$(t) (incoming radar signal), which is provided by the RX antenna 6, is directed to a mixer 104. In the present example, the received signal $y_{RF}$(t) (i.e., the antenna signal) is pre-amplified by RF amplifier 103 (gain g), so that the mixer receives the amplified signal $g \cdot y_{RF}$(t) at its RF input port. The mixer 104 further receives the LO signal $s_{LO}$(t) at its reference input port and is configured to down-convert the amplified signal $g \cdot y_{RF}$(t) into the base band. The resulting base-band signal at the mixer output is denoted as $y_{BB}$(t). The base-band signal $y_{BB}$(t) is further processed by the analog base band signal processing chain 20 (see also FIG. 3), which basically includes one or more filters (e.g., a band-pass 21) to remove undesired side bands and image frequencies as well as one or more amplifiers such as amplifier 22). The analog output signal, which may be supplied to an analog-to-digital converter (cf. FIG. 3), is denoted as y(t). Various techniques for the digital post-processing of the digitized output signals (digital radar signal) are as such known (e.g., Range Doppler Analysis) and thus not further explained herein.

In the present example, the mixer 104 down-converts the RF signal $gy_{RF}$(t) (amplified antenna signal) into the base band. The respective base band signal (mixer output signal) is denoted by $y_{BB}$(t). The down-conversion may be accomplished in a single stage (i.e., from the RF band into the base band) or via one or more intermediate stages (from the RF band into an IF band and subsequently into the base band). In view of the example of FIG. 4, it is clear that the quality of the radar measurement will heavily depend on the quality of the LO signal $s_{LO}$(t). Low phase noise, as well as steep and highly linear frequency ramps are desired properties of the LO signal $s_{LO}$(t).

Figure 5:
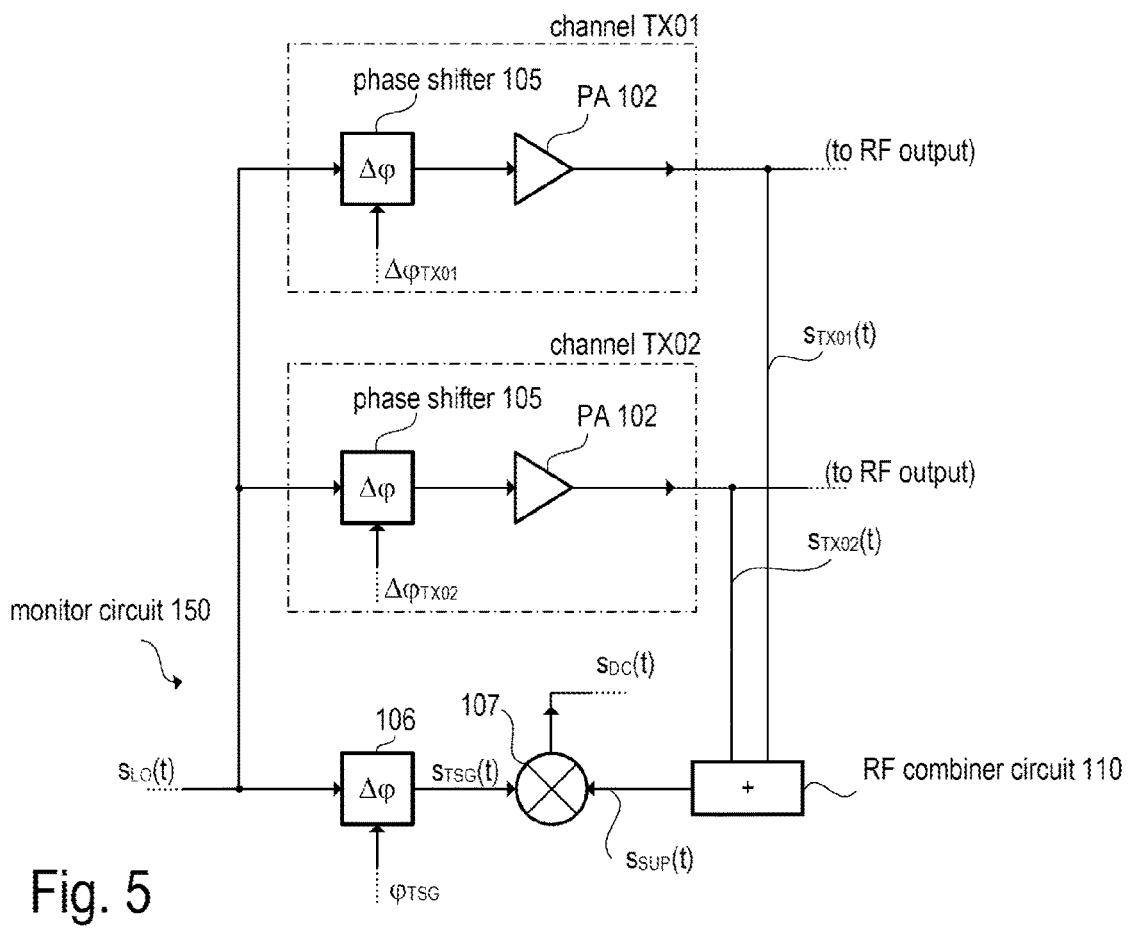
FIG. 5 is a block diagram illustrating one example of a monitor circuit that may be used to sense the phase lags and gains caused by two or more RF channels of an RF circuit.

FIG. 5 is a block diagram illustrating one example of an RF circuit with multiple RF channels for generating multiple RF output signals. In the present example, two transmission channels TX01 and TX02 of a radar sensor are considered as one illustrative application. The concept can be generalized to a system with c channels. However, for a better understanding, one exemplary embodiment with two channels TX01, TX02, will be described first with reference to FIGS. 5 to 8 and equation 1 to 22, whereas FIGS. 9 to 11 and equations 23 to 24 relate to a general embodiment with c channels TX01, TX02, TXc. Furthermore, it is understood that the concept described below may readily be employed in other applications than radar. Furthermore, it is noted that the circuit of FIG. 5 can readily be enhanced to more than two channels (see also FIG. 7). In the present example, each channel TX1 and TX2 is configured to receive, at its input, an RF oscillator signal $s_{LO}$(t), which may be provided from a local oscillator (see, e.g., FIG. 4, local oscillator 101). Each channel TX1 and TX2 may include a phase shifter 105 for manipulating the overall phase lags caused by channels. The RF output signals of the channels TX01 and TX02 are denoted as $s_{TX01}$(t) and $s_{TX02}$(t), respectively. In each channel TX01, TX02 the signal path from the input to the output includes signal lines and one or more circuit components that may cause a phase lag. As a consequence, the output signals can be written as follows:

$$s_{TX01}(t) = A_{TX01} \cdot \cos(2\pi f_{LO} t + \varphi_{TX01} + \Delta\varphi_{TX01}) \quad (1)$$

$$s_{TX02}(t) = A_{TX02} \cdot \cos(2\pi f_{LO} t + \varphi_{TX02} + \Delta\varphi_{TX02}) \quad (2)$$

Thereby, the variables $A_{TX01}$ and $A_{TX02}$ denote the amplitudes of the RF output signals $s_{TX01}$(t) and $s_{TX02}$(t), and the frequency $f_{LO}$ is the frequency of the RF oscillator signal $s_{LO}$(t). The phases $\varphi_{TX01}$ and $\varphi_{TX02}$ represent the phase lag caused by the channels TX01 and TX02, respectively, without considering phase shifters 105, whereas $\Delta\varphi_{TX01}$ and $\Delta\varphi_{TX02}$ denote the additional the phase shifts caused by the phase shifters 105.

At this point it is noted that the phases $\varphi_{TX01}$ and $\varphi_{TX02}$ as well as the amplitudes $A_{TX01}$ and $A_{TX02}$ heavily depend on the operating conditions of the system. For example, depending on which of the channels TX01 and TX02 is active, the temperature of the chip (e.g., the MMIC) will vary due to the power losses caused in the active channel(s). When both channels, TX01 and TX02, are active (i.e., outputting an RF signal) the temperature will be much higher as compared to the case, in which only one channel, TX01 or TX02, is active. Amplitudes and phases of the RF output signals $s_{TX01}$(t) and $s_{TX02}$(t) are temperature dependent. For example, in beam forming applications (in which the results of amplitude and phase measurement are applied) both channels TX01 and TX02 are active (transmitting), which causes the temperature to rise to a specific value and thus particular amplitude and phase values. Amplitude and values shifts measured in a configuration, in which only one of the channels (TX01 or TX02) is active, would be different and thus incorrect (as the configuration which only one active channel does not resemble the beamforming application. Accordingly, it may be important to allow measurement of amplitude and phase values while both of the channels are active.

As mentioned, each channel TX01, TX02 includes a phase shifter 105, which are configured to generate additional phase shift values $\Delta\varphi_{TX01}$ and $\Delta\varphi_{TX02}$ (phase lags), which contribute to the phases of the RF output signals $s_{TX01}(t)$ and $s_{TX02}(t)$. Furthermore, each channel TX01, TX02 may include an RF amplifier 102 (e.g., a power amplifier, PA). In this case, the amplitudes $A_{TX01}$ and $A_{TX02}$ of the RF output signals $s_{TX01}(t)$ and $s_{TX02}(t)$ depend on the gains of the RF amplifiers 102. In accordance with one specific example, the phase shifters 105 may be implemented using IQ modulators (In-Phase/Quadrature modulators, also referred to as Quadrature modulators). Digital-to-analog converters (not shown) may be used to convert digital values representing the phase shift values $\Delta\varphi_{TX01}$ and $\Delta\varphi_{TX02}$ into analog signals that can be processed by the IQ modulators.

In some applications (e.g., for the system controller 50 or a radar sensor, see FIG. 3) it may be desirable to know the phases of the RF output signals of the different channels, e.g., relative to each other or relative to a reference phase. For example, the channels TX01 and TX02 may be transmission channels of a radar sensor device and the phases of the RF output signals will be tuned to specific values to achieve a desired radiation angle. As the absolute phase lags caused by the circuit components (e.g., the amplifiers 102) included in the channels TX01 and TX02 may be temperature dependent and may also be subject to production tolerances and aging, the respective phases $\varphi_{TX01}$ and $\varphi_{TX02}$ need to be tuned or monitored, which may be accomplished by the phase shifters 105 included in the channels TX01, TX02. In order to be able to monitor the phases $\varphi_{TX01}$ and $\varphi_{TX02}$ of the RF output signals $s_{TX01}(t)$ and $s_{TX02}(t)$, a monitor circuit 150 (including, e.g., phase shifter 106 and mixer 107, see FIG. 5) is provided that is used to sense the phases $\varphi_{TX01}$ and $\varphi_{TX02}$ and thus to detect a possible maladjustment of the phases. In the event that the measured phases $\varphi_{TX01}$ and $\varphi_{TX02}$ deviates from a desired setting, the phase shifters 105 may be used to compensate for the deviation by adding additional phase shifts $\Delta\varphi_{TX01}$ and $\Delta\varphi_{TX02}$.

In the example shown in FIG. 5, the RF output signals $s_{TX01}(t)$ and $s_{TX02}(t)$ are tapped and supplied to an RF combiner circuit 110, which may be configured to combine the RF output signals $s_{TX01}(t)$ and $s_{TX02}(t)$. For example, the combined signal $s_{SUP}(t)$ may be a superposition of the RF output signals such as $$s_{SUP}(t) = g_{SUP} \cdot (s_{TX01}(t) + s_{TX02}(t)), \quad (3)$$

wherein $g_{SUP}$ is a defined gain (usually significantly smaller than 1). However, for the present considerations we may assume that $g_{SUP}$ is 1 without loss of generality and thus the combined signal can be written as:

$$s_{SUP}(t) = A_{TX01} \cdot \cos(2\pi f_{LO} t + \varphi_{TX01} + \Delta\varphi_{TX01}) + \quad (4)$$
$$A_{TX02} \cdot \cos(2\pi f_{LO} t + \varphi_{TX02} + \Delta\varphi_{TX02}).$$

The monitor circuit 150 includes a mixer 107 receiving the combined signal $s_{SUP}(t)$ at its RF port and configured to down-convert the combined signal $s_{SUP}(t)$ using the RF oscillator signal $s_{LO}(t)$. As, in the present embodiment, all RF signals have the same frequency $f_{LO}$, the mixer output signal will be a DC value $s_{DC}(t)$ that depends on the phases of $\varphi_{TX01} + \Delta\varphi_{TX01}$ and $\varphi_{TX02} + \Delta\varphi_{TX02}$ of the RF output signals $s_{TX01}(t)$ and $s_{TX02}(t)$. In the present example, the mixer 107 receives a phase shifted version of the RF oscillator signal $s_{LO}(t)$; the phase-shifted oscillator signal can thus be expressed as $$s_{TSG}(t) = A_{TSG} \cdot \cos(2\pi f_{LO} t + \varphi_{TSG}), \quad (5)$$

wherein $A_{TSG}$ is the known signal amplitude and $\varphi_{TSG}$ the phase of the signal $s_{TSG}(t)$ received at the reference port of the mixer 107. The phase $\varphi_{TSG}$ may be set by a phase shifter 106 coupled to the reference port of the mixer 107 upstream thereto. In other embodiments, the frequency $f_{TSG}$ of the signal $s_{TSG}(t)$ may be different from $f_{LO}$ (i.e., $f_{TSG} \neq f_{LO}$) and, as a consequence, the mixer output signal is not a DC signal but rather an intermediate frequency (IF) signal $s_{IF}(t)$ having a frequency $f_{IF}$ corresponding to the difference $f_{LO} - f_{TSG}$.

Without loss of generality, amplitude $A_{TSG}$ is assumed to equal 2; a different amplitude will only cause a respective scaling of the measured signal amplitudes. Using equations 4 and 5 and $A_{TSG} = 2$, the mixer output signal $s_{DC}(t)$ provided at the output port of the mixer 107 can be expressed as $$s_{DC}(t) = s_{LO}(t) \cdot s_{SUP}(t) = (A_{TX01} \cdot \cos(\varphi_{TSG} - \varphi_{TX01} - \Delta\varphi_{TX01}) + \quad (6)$$
$$A_{TX02} \cdot \cos(\varphi_{TSG} - \varphi_{TX02} - \Delta\varphi_{TX02})) + (A_{TX01} \cdot$$
$$\cos(4\pi f_{LO} t + \varphi_{TX01} + \Delta\varphi_{TX01}) + A_{TX02} \cdot \cos(4\pi f_{LO} t + \varphi_{TX02} + \Delta\varphi_{TX02})),$$

wherein the summands representing an oscillation at the double frequency $2f_{LO}$ (angular frequency $4\pi f_{LO}$) can be neglected as they are outside of the mixer bandwidth. Accordingly, the mixer output signal $s_{DC}(t)$ can be written as:

$$s_{DC}(t) \approx \quad (7)$$
$$(A_{TX1} \cdot \cos(\varphi_{TSG} - \varphi_{TX1} - \Delta\varphi_{TX01}) + A_{TX02} \cdot \cos(\varphi_{TSG} - \varphi_{TX02} - \Delta\varphi_{TX02})).$$

Accordingly, the mixer output signal is a DC signal that depends on the cosines of the phase-differences $\varphi_{TSG} - \varphi_{TX1} \Delta\varphi_{TX01}$ and $\varphi_{TSG} - \varphi_{TX2} - \Delta\varphi_{TX02}$, the amplitudes $A_{TX1}$ and $A_{TX2}$. Without loss of generality, for the subsequently described measurements of the of the mixer output signal $s_{DC}(t)$ the phase shift values $\Delta\varphi_{TX01}$ and $\Delta\varphi_{TX02}$ are assumed to be either 0 or $\pi$ rad, i.e., 0 or 180 degrees. According to the herein described examples, measurements may be made by acquiring discrete samples of the mixer output signal $s_{DC}(t)$ at sampling times $t_{k,0}$, $t_{k,1}$, and $t_{k,2}$. The index k denotes the measurement cycle (k=1, 2, 3, . . . ).

The measured DC values (sampled values) of the mixer output signal $s_{DC}(t)$ may be used to calculate the sought phase values $\varphi_{TX01}$ and $\varphi_{TX02}$ and amplitude values $A_{TX01}$ and $A_{TX02}$ as explained below. As mentioned above, the phase $\varphi_{TSG}$ can be set by the phase shifter 106 included in the monitor circuit 150. For a defined value of the phase $\varphi_{TSG}$ the following three measurement values can be obtained $$s_{DC}(t_{k,0}) = \qquad (8)$$
$$(A_{TX01} \cdot \cos(\varphi_{TSG} - \varphi_{TX01} - 0) + A_{TX02} \cdot \cos(\varphi_{TSG} - \varphi_{TX02} - 0)),$$

$$s_{DC}(t_{k,1}) = \qquad (9)$$
$$(A_{TX01} \cdot \cos(\varphi_{TSG} - \varphi_{TX01} - 0) + A_{TX02} \cdot \cos(\varphi_{TSG} - \varphi_{TX02} - \pi)),$$

$$s_{DC}(t_{k,2}) = \qquad (10)$$
$$(A_{TX01} \cdot \cos(\varphi_{TSG} - \varphi_{TX01} - \pi) + A_{TX02} \cdot \cos(\varphi_{TSG} - \varphi_{TX02} - 0)).$$

The first value $s_{DC}(t_{k,0})$ is equal to equation 6 for the measurement time $t=t_{k,0}$. For the measurement of the second value $s_{DC}(t_{k,1})$ an additional phase shift of 180 degree (i.e., $\pi$ rad) is generated in channel TX02. This may be accomplished by temporarily increasing the phase lag caused by phase shifter 105 in the channel TX02 by 180 degrees. For the measurement of the third value $s_{DC}(t_{k,2})$ an additional phase shift of 180 degree (i.e., $\pi$ rad) is generated in channel TX01. This may be accomplished by temporarily increasing the phase lag caused by phase shifter 105 in channel TX01 by 180 degrees (analogously to channel TX02). Accordingly, three samples $s_{DC}(t_{k,0})$, $s_{DC}(t_{k,1})$, and $s_{DC}(t_{k,2})$ are acquired in each measurement cycle in the present example of two channels. As shown later, n+1 samples are acquired in each measurement cycle in the general example with c channels. It is noted, however, that in the present case with only two channels, the third measurement is redundant and thus optional. However, the third measurement allows a plausibility check for the measured values.

The identity $$\cos(\varphi - \pi) \equiv \cos(\varphi + \pi) \equiv -\cos(\varphi) \qquad (11)$$

can be used to simplify equations 9 and 10. Accordingly, the second and the third value (see equations 9 and 10) can be expressed as $$s_{DC}(t_{k,1}) = (A_{TX01} \cdot \cos(\varphi_{TSG} - \varphi_{TX01}) - A_{TX02} \cdot \cos(\varphi_{TSG} - \varphi_{TX02})), \text{ and } \quad (12)$$

$$s_{DC}(t_{k,2}) = (-A_{TX01} \cdot \cos(\varphi_{TSG} - \varphi_{TX01}) + A_{TX02} \cdot \cos(\varphi_{TSG} - \varphi_{TX02})), \quad (13)$$

respectively. Adding equations 8 and 12 and equations 8 and 13 yields the measured values $$M_{01}[k] = (s_{DC}(t_{k,0}) + s_{DC}(t_{k,1})) = 2A_{TX01} \cdot \cos(\varphi_{TSG} - \varphi_{TX01}), \text{ and } \quad (14)$$

$$M_{02}[k] = (s_{DC}(t_{k,0}) + s_{DC}(t_{k,2})) = 2A_{TX02} \cdot \cos(\varphi_{TSG} - \varphi_{TX02}). \quad (15)$$

As mentioned above, the acquisition of the third sample $s_{DC,2}(t_k)$ (equation 15) is redundant in the present embodiment as subtracting equation 12 from equation 8 yields the same result as equation 15:

$$M_{02}[k] = (s_{DC}(t_{k,0}) - s_{DC}(t_{k,1})) = 2A_{TX02} \cdot \cos(\varphi_{TSG} - \varphi_{TX02}). \quad (16)$$

The value $M_{01}[k]$ only depends on the phase difference $\varphi_{TSG}-\varphi_{TX01}$ and the amplitude $A_{TX01}$ of the RF output signal $s_{TX01}(t)$ of channel TX01. Similarly, the value $M_{02}[k]$ only depends on the phase difference $\varphi_{TSG}-\varphi_{TX02}$ and the amplitude $A_{TX02}$ of the RF output channel $s_{TX02}(t)$ of channel TX02. It is noted that the term "measured value" or "sampled value" is used for the values $M_{01}[k]$ and $M_{02}[k]$, which are, in fact, not directly measured but calculated based on the sampled mixer output values $s_{DC}(t_{k,0})$, $s_{DC}(t_{k,1})$ and $s_{DC}(t_{k,2})$. Nevertheless, those values $M_{01}[k]$ and $M_{02}[k]$ are regarded as an (intermediate) result of the measurement described herein and thus referred to as "measured values" which represent samples of the RF output signals $s_{TX01}(t)$, $s_{TX01}(t)$ of the RF channels TX01, TX02. As will be shown later c values $M_{01}[k]$, $M_{02}[k]$, ..., $M_c[k]$ can be calculated in an example with c channels TX01, TX02, ..., TXc.

If the amplitudes $A_{TX01}$ and $A_{TX02}$ are measured separately (e.g., by using power sensors coupled to the outputs of channels TX01 and TX02), the sought phases $\varphi_{TX01}$ and $\varphi_{TX02}$ can be directly calculated from the measured values $M_{01}[k]$ and $M_{02}[k]$ obtained in one measurement cycle. However, the measurements may be repeated for different values $\varphi_{TSG}$; the phase value provided by phase shifter 106 in the k-th measurement cycle is denoted as $\varphi_{TSG}[k]$. Thus, the measured values of equations 14 and 15 become $$M_{01}[k] = 2A_{TX01} \cdot \cos(\varphi_{TSG}[k] - \varphi_{TX01}), \text{ and } \quad (17)$$

$$M_{02}[k] = 2A_{TX02} \cdot \cos(\varphi_{TSG}[k] - \varphi_{TX02}). \quad (18)$$

Theoretically, four measured values, for example $M_{01}[k]$, $M_{02}[k]$, $M_{01}[k+1]$ and $M_{02}[k+1]$ obtained in the measurement cycles k and k+1, would be sufficient to calculate the sought phases $\varphi_{TX01}$ and $\varphi_{TX02}$ and amplitudes $A_{TX01}$ and $A_{TX02}$ provided that $\varphi_{TSG}[k+1] \neq \varphi_{TSG}[k]$. In practice, a plurality of measured values can be obtained in a plurality of measurement cycles for different phase values $\varphi_{TSG}[k]$ and used to estimate the sought phases $\varphi_{TX01}$ and $\varphi_{TX02}$ and amplitudes $A_{TX01}$ and $A_{TX02}$ with improved precision.

Figure 6:
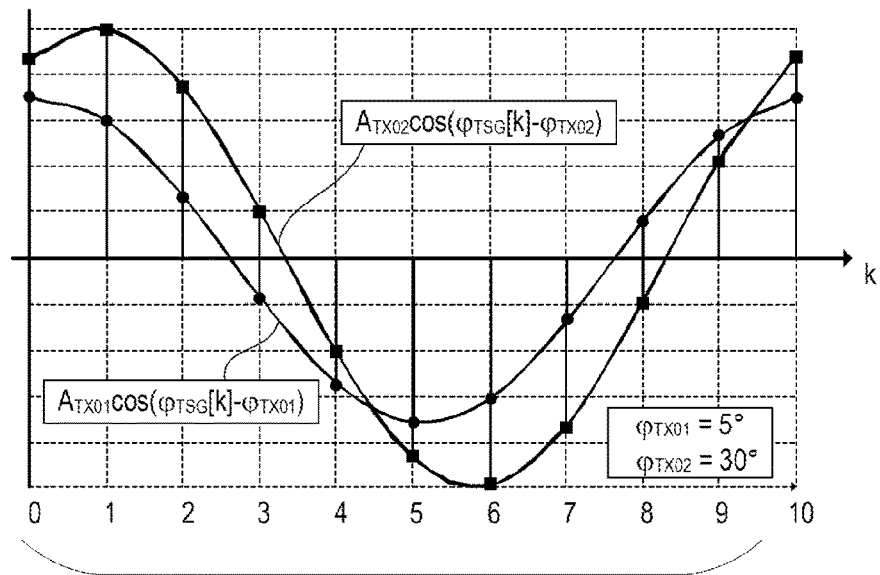
FIG. 6 is a diagram illustrating one example of a measurement sequence for measuring phases and signal amplitudes of the RF output signals of a multi-channel RF circuit using a circuit in accordance with the embodiments described herein.

The diagram of FIG. 6 illustrates the measured values $M_{01}[k]$ and $M_{02}[k]$ for a sequence of measurement cycles, wherein $\varphi_{TSG}[k]=k\pi/5$ and k=0, 1, ... 10. That is, the phase $\varphi_{TSG}$ provided by the phase shifter 106 is increased from zero degrees in steps of 36 degrees up to 360 degrees. The measured values $M_{01}[0]$, $M_{01}$ $M_{01}[10]$ can be used to estimate amplitude $A_{TX01}$ and phase $\varphi_{TX01}$ using equation 17 as signal model and any suitable estimation technique such as a non-linear least mean squares (LMS) method. Similarly, the measured values $M_{02}[0]$, $M_{02}[1]$, ... $M_{02}[10]$ can be used to estimate amplitude $A_{TX02}$ and phase $\varphi_{TX02}$ using equation 18 as signal model. In one specific example, a Fourier transform algorithm such the Fast Fourier Transform (FFT) is used for the estimation of amplitudes and phases. In this case, the phase $\varphi_{TSG}[k]$ may be increased in each measurement cycle using a constant step size; alternatively, the measured sequences may be resampled to obtain equidistant sampling points.

Figure 7:
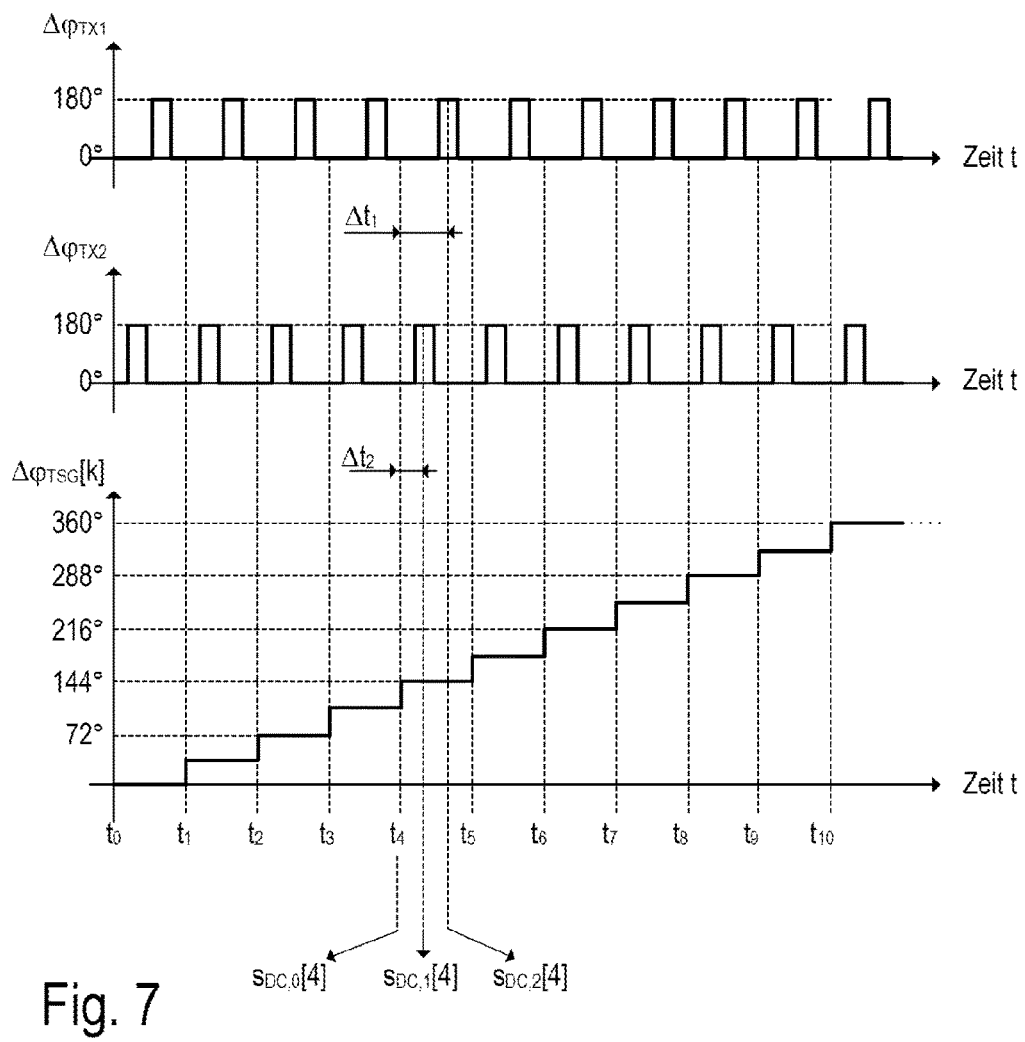
FIG. 7 includes timing diagrams illustrating the purpose and function of the circuit of FIG. 5 in more detail.

The measurement sequence shown in FIG. 6 is further illustrated by the timing diagrams of FIG. 7. FIG. 7 includes timing diagrams illustrating the phase shift values $\varphi_{TSG}[k]$, $\Delta\varphi_{TX01}$, and $\Delta\varphi_{TX02}$ generated by the phase shifter 106 of the monitor circuit 105 the phase shifter 105 of the first channel TX01, and the phase shifter 105 of the second channel TX02, respectively. The start time of the measurement cycles is denoted as $t_k$, and the corresponding phase value generated by phase shifter 106 as $\varphi_{TSG}[k]$, wherein k=0, 1, 2, 3, etc. As shown in previous FIG. 6, the phase $\varphi_{TSG}[k]$ is increased in each measurement cycle. In the present example, the step size is $\pi/5$ rad (i.e., 36 degrees), and thus $\varphi_{TSG}[k]=k\pi/5$.

Three samples of the mixer output signal $s_{DC}(t)$ are sampled in each measurement cycle, that is $s_{DC,0}[k]$, $s_{DC,1}[k]$, and $s_{DC,2}[k]$, wherein (cf. equations 8-10)

$$s_{DC,0}[k] = s_{DC}(t_k) = s_{DC}(t_{k,0}), \quad (19)$$

$$s_{DC,1}[k] = s_{DC}(t_k + \Delta t_1) = s_{DC}(t_{k,1}), \quad (20)$$

$$s_{DC,2}[k] = s_{DC}(t_k + \Delta t_2) = s_{DC}(t_{k,2}). \quad (21)$$

In FIG. 4 the sampling times are shown for the measurement cycle k=4. The phase shifts $\Delta\varphi_{TX01}$, and $\Delta\varphi_{TX02}$ generated by the phases shifters 105 in channels TX01 and TX02 alternate between 0 and $\pi$ rad (i.e., 180 degrees) in such a manner that—at the sampling time $t_k+\Delta t_2$—the phase lag caused by channel TX02 is inverted (i.e., $\varphi_{TX02} \rightarrow \varphi_{TX02} \pm \pi$), while the phase lag caused by channel TX01 is left unchanged and that—at the sampling time $t_k+\Delta t_1$ the phase lag caused by channel TX01 is inverted (i.e., $\varphi_{TX01} \rightarrow \varphi_{TX01} \pm \pi$), while the phase lag caused by channel TX02 is left unchanged. The three samples obtained in each measurement cycles can be used to calculate the measured values $M_{01}[k]$ and $M_{02}[k]$, for example, in accordance with equations 14 and 15. Subsequently, the measured values $M_{01}[k]$ and $M_{02}[k]$ (for k=1, 2, 3, etc.) can be used to estimate the sought amplitude values $A_{TX01}$ and $A_{TX02}$ and phase values $\varphi_{TX01}$ and $\varphi_{TX02}$.

It is noted that the time spans $\Delta t_1$ and $\Delta t_2$ are not necessarily constant throughout the measurement cycles k. Further, the time instants $t_k$ are not necessarily equidistant in time as there is no need for a synchronous sampling in accordance with a clock signal. In each measurement cycle, the value $s_{DC,0}[k]$ may be sampled once the phase value $\varphi_{TSG}[k]$ has been updated, the value $s_{DC,1}[k]$ may be sampled once the phase $\varphi_{TX02}$ has been inverted, and the value $s_{DC,2}[k]$ may be sampled once the phase $\varphi_{TX01}$ has been inverted and the inversion of phase $\varphi_{TX02}$ has been undone. Subsequently, the phase value $\varphi_{TSG}[k]$ is updated and the next cycle starts (k→k+1).

Figure 8:
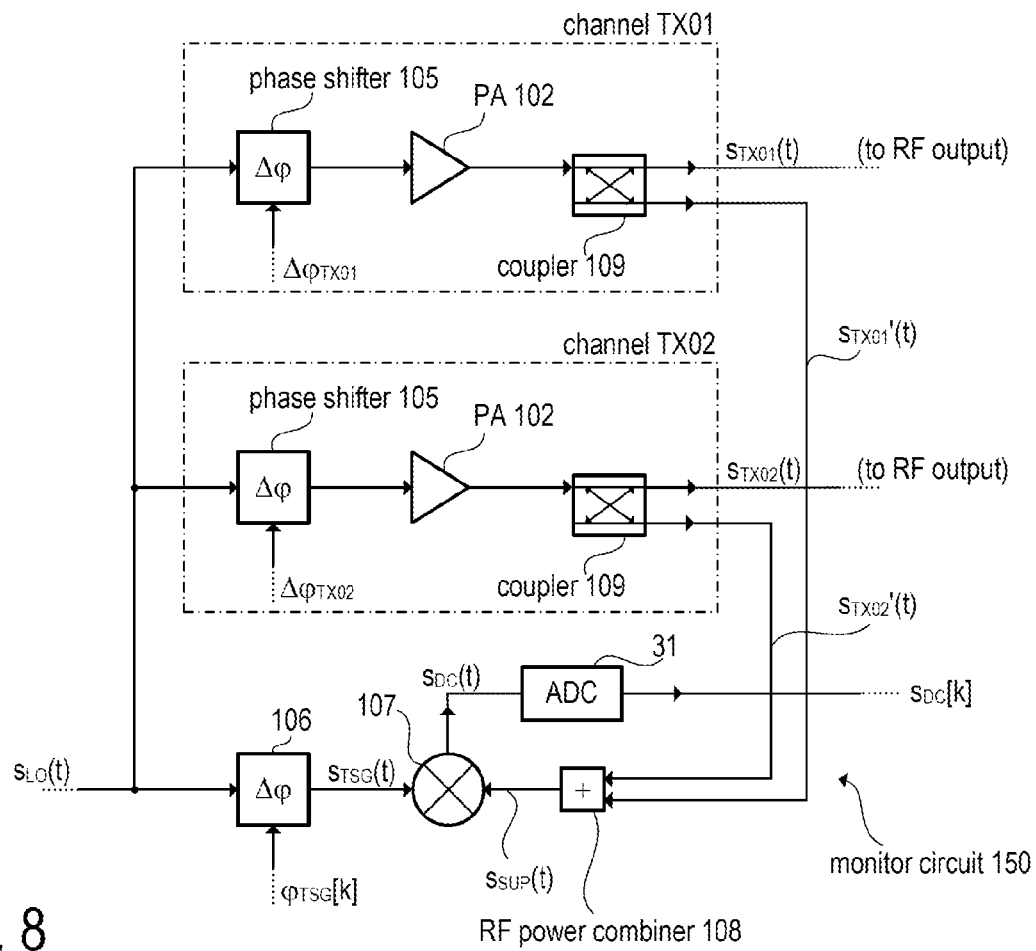
FIG. 8 is a block diagram illustrating one exemplary implementation of the example of FIG. 5.

FIG. 8 illustrates one exemplary implementation of the previous example of FIG. 5 in more detail. The example of FIG. 8 is substantially the same as the previous example of FIG. 5; however, the implementation of the RF combiner circuit 110 is shown in more detail as well as the analog-to-digital converter 31 used to digitize the mixer output signal $s_{DC}(t)$. In accordance with the present example, the combiner circuit 110 as shown in previous FIG. 5 is implemented using a power combiner 108 (e.g., a Wilkinson power combiner that provides a linear combination of the signals) and directional couplers 109 (e.g., rat-race couplers, circulators, or the like), wherein one coupler is arranged in each channel TX01 and TX02, and configured to direct a fraction of the power of the respective output signal $s_{TX01}(t)$ and $s_{TX02}(t)$ to the inputs of the power combiner 108. The signals branched-off at the outputs of the channels TX01 and TX02 by the couplers 109 are denoted as $s_{TX01}'(t)$ and $s_{TX02}'(t)$, wherein $s'_{TX01}(t)=g_c s_{TX01}(t)$ and $s'_{TX02}(t)=g_c s_{TX02}(t)$ and $g_c$ is the transmission coefficient of the coupler with regards to the branched-off signal. Usually $g_c$ is significantly lower than 1, while the transmission coefficient with regards to the antenna signal is approximately 1. The power combiner 108 essentially provides the (e.g., scaled) sum of the input signals, that is $$s_{SUP}(t) = g_{COMB} \cdot (s'_{TX01}(t) + s'_{TX02}(t)) = g_{SUP} \cdot (s_{TX01}(t) + s_{TX02}(t)), \quad (22)$$

wherein the gain $g_{SUP}$ equals $g_{COMB} \cdot g_c$. Accordingly, the combined signal $s_{SUP}(t)$ is substantially a scaled version of the sum of the channel output signals $s_{TX01}(t)$ and $s_{TX02}(t)$ (see also equation 3). However, as mentioned above, the gain $g_{SUP}$ may be assumed to be 1 for the present discussion without loss of generality. Apart from the RF combiner circuit 110, which is implemented by the couplers 109 and the RF power combiner 108, the example of FIG. 8 is the same as the example of FIG. 5 and reference is made to the explanations above.

Figure 9:
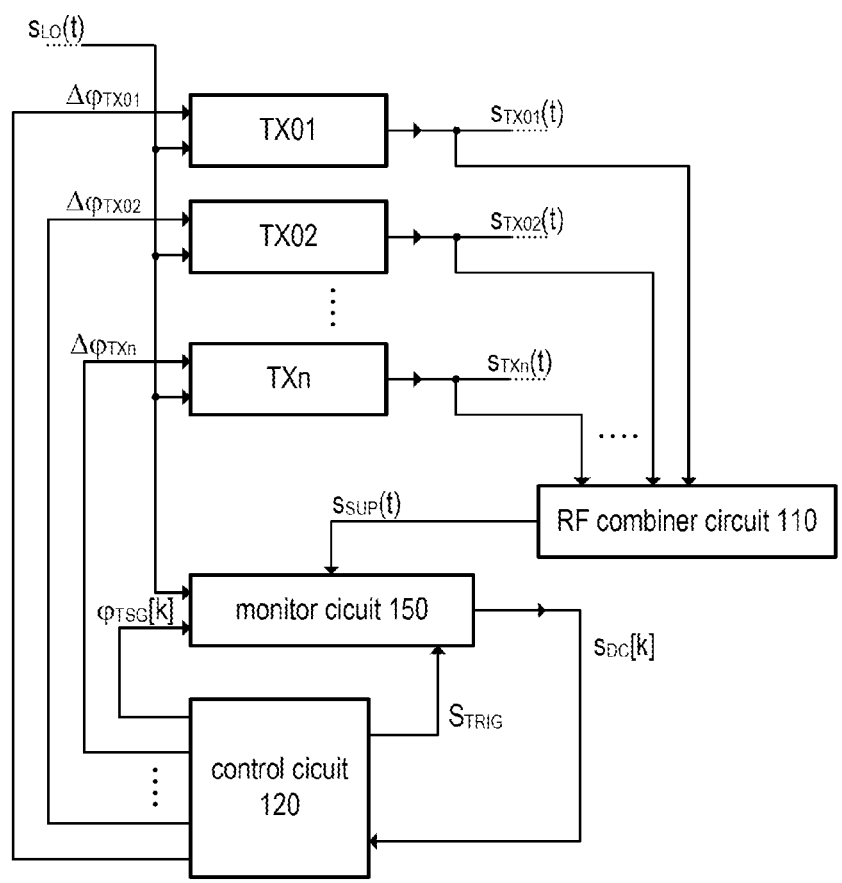
FIG. 9 is a block diagram illustrating a general example of an RF circuit with multiple RF channels providing multiple RF output signals, a monitor circuit that may be used to sense phases and amplitudes of the RF output signals, and a control circuit for controlling measurement sequences that may be performed by the monitor circuit.

As already indicated above, the concept described above with regards to two channels TX01 and TX02 may be readily extended to c channels TX01, TX02, . . . , TXc, wherein c>2. In this case the RF combiner circuit 110 (see FIG. 5) or the RF power combiner 108 (see FIG. 8) has c inputs. Alternatively, several power combiners may be cascaded to combine the desired number of RF signals. Irrespective of the implementation of the RF combiner circuit 110 the combined signal $s_{SUP}(t)$ can be regarded as a (scaled) superposition of the RF output signals $s_{TX01}(t)$, $s_{TX02}(t)$, . . . , $s_{TXc}(t)$. This situation is illustrated in the example of FIG. 9. Examples of phase switching schemes, which may be used in each measurement cycle, are explained with reference to FIGS. 10 and 11.

According to the example of FIG. 9, an RF circuit includes a plurality of channels TX01, TX02, . . . , TXc configured to receive the RF oscillator signal $s_{LO}(t)$ and the respective phase shift values $\Delta\varphi_{TX01}$, $\Delta\varphi_{TX02}$ . . . $\Delta\varphi_{TXc}$ for the phases shifters 105 (see FIG. 5), and to provide the respective RF output signals $s_{TX01}(t)$, $s_{TX02}(t)$, . . . , $s_{TXc}(t)$. Each of the RF output signals is characterized by an amplitude $A_{TX01}$, $A_{TX02}$, . . . , $A_{TXc}$, and a phase $\varphi_{TX01}$, $\varphi_{TX02}$, . . . , $\varphi_{TXc}$, which are to be estimated using the concept described herein, that is:

$$s_{TX01}(t) = A_{TX01} \cdot \cos(2\pi f_{LO} t + \varphi_{TX01} + \Delta\varphi_{TX01}) \quad (23)$$

$$\vdots$$

$$s_{TXc}(t) = A_{TXc} \cdot \cos(2\pi f_{LO} t + \varphi_{TXc} + \Delta\varphi_{TXc}).$$

The above-mentioned combined signal $s_{SUP}(t)$ is supplied to the monitor circuit 150 which is configured to down-convert the combined signal $s_{SUP}(t)$ as explained above with reference to FIGS. 5 and 8. The mixer output signal $s_{DC}(t)$ may be digitized and provided as digital signal. As also explained with reference to FIG. 5, the monitor circuit receives a phase value $\varphi_{TSG}[k]$ which determines the phases of the RF local oscillator signal $s_{TSG}(t)$ used for the down-conversion (see equation 5).

The RF circuit of FIG. 9 may include a control circuit 120 which may include, for example, a programmable processor such as a (e.g., embedded) micro controller or a similar device. The functions provided by the controller circuit 120 may be (e.g., fully or partly) provided by the system controller 50 (see FIG. 3). Additionally or alternatively, the functions provided by the controller circuit 120 may be at least partly be provided by the DSP 40 (see FIG. 3). As such the controller circuit 120 in FIG. 9 represents a portion of the functions of the system controller 50 and/or the DSP 40. In an alternative embodiment, the controller circuit 120 may be implemented in the same MMIC as the monitor circuit 150 and the channels TX01, TX02, etc., but separate from the system controller 50.

As mentioned above, three samples $s_{DC,0}[k]$, $s_{DC,1}[k]$ and $s_{DC,2}[k]$ are acquired—in each measurement cycle k—in case of two channels and c+1 samples in case of c channels $s_{DC,0}[k]$, $s_{DC,1}[k]$, . . . , $s_{DC,c}[k]$. Theoretically a single measurement cycle is sufficient to determine the phase values $\varphi_{TX01}$, $\varphi_{TX02}$ . . . , $\varphi_{TXc}$ associated with the c channels TX01, TX02, . . . , TXc, and at least two measurement cycles are needed to determine the phase values $\varphi_{TX01}$, $\varphi_{TX02}$, . . . , $\varphi_{TXc}$ and the respective amplitude values $A_{TX01}$, $A_{TX02}$, . . . , $A_{TXc}$. In practice, however, a plurality of measurement cycles are performed in order to improve the quality of phase and amplitude estimation. In one illustrative exemplary embodiment, 64 measurement cycles are performed which allows the use of a 64 point FFT (Fast Fourier Transform) algorithm to estimate phase and amplitude values of each channel.

The controller circuit 120 may be configured to provide the phase shift values $\Delta\varphi_{TX01}$, $\Delta\varphi_{TX02}$, . . . , $\Delta\varphi_{TXc}$ for the phases shifters 105 of the channels TX01, TX02, . . . , TXc as well as the phase value $\varphi_{TSG}[k]$ for the phases shifter 106 of the monitor circuit 150. Furthermore, the control circuit may generate a trigger signal $S_{TRIG}$ used to trigger the analog-to-digital converter 31 included in the monitor circuit 150 at the desired sampling times (e.g., times $t_{k,0}=t_k$, $t_{k,1}=t_k+\Delta t_1$, $t_{k,2}=t_k+\Delta t_2$, etc.). In particular, the controller circuit 120 may be configured to control the data acquisition during a plurality of measurement cycles in accordance with a scheme shown, e.g., in FIGS. 6 and 7. Accordingly, the phase value $\varphi_{TSG}[k]$ is updated in each measurement cycle k, and c+1 measurements are made in each cycle. According to one embodiment, the following c+1 values may be sampled in each measurement cycle: $s_{DC,0}[k]$, $s_{DC,1}[k]$, . . . , $s_{DC,c}[k]$ (see also FIG. 10A). Thereby, all phase shift values $\Delta\varphi_{TX01}$, $\Delta\varphi_{TX02}$, . . . , $\Delta\varphi_{TXc}$ are set in accordance with a defined phase configuration (referred to as reference configuration, e.g., all phase shifts may be set to zero) when sampling $s_{DC,0}[k]$; then all phase shift values $\Delta\varphi_{TX01}$, $\Delta\varphi_{TX02}$, . . . , $\Delta\varphi_{TXn}$ except the i-th phase shift value $\Delta\varphi_{TXi}$ is inverted (i.e., increased or decreased by 180°) when sampling $s_{DC,1}[k]$ (for i=1, 2, . . . , c) as illustrated in the scheme shown in FIG. 10A. Analogously to equations 14 and 15, the measured values may be determined as follows in each measurement cycle k (see also FIG. 10B):

$$M_{01}[k] = (s_{DC,0}[k] + s_{DC,1}[k]) = A_{TX01} \cdot \cos(\varphi_{TSG}[k] - \varphi_{TX01}), \quad (24)$$

$$M_{02}[k] = (s_{DC,0}[k] + s_{DC,2}[k]) = A_{TX02} \cdot \cos(\varphi_{TSG}[k] - \varphi_{TX02}),$$

$$\vdots$$

$$M_c[k] = (s_{DC,0}[k] + s_{DC,c}[k]) = A_{TXc} \cdot \cos(\varphi_{TSG}[k] - \varphi_{TXc}).$$

By stepwise increasing the phases $\varphi_{TSG}[k]$—in each measurement cycle—k samples of the RF output signals $s_{TX01}(t)$, $s_{TX02}(t)$, . . . , $s_{TXc}(t)$ can be determined as illustrated in the diagram of FIG. 6 and known estimation algorithms may be used to estimate the amplitudes $A_{TX01}$, $A_{TX02}$, . . . , $A_{TXc}$ and phases $\varphi_{TX01}$, $\varphi_{TX02}$, . . . , $\varphi_{TXc}$ as discussed above with reference to FIGS. 5 to 7.

It is noted that varying the phases value $\varphi_{TSG}[k]$ is equivalent to simultaneously varying all phase shift values $\Delta\varphi_{TX01}$, $\Delta\varphi_{TX02}$, . . . , $\Delta\varphi_{TXc}$ of the phase shifters 105 (where applicable in addition to the phase inversion). This is evident, for example, from equation 24; one can see that, e.g., $\varphi_{TSG}[k]=10°$ yields the same result as $\varphi_{TSG}[k]=0°$, if instead the phase shift values $\Delta\varphi_{TX01}$, $\Delta\varphi_{TX02}$, . . . , and $\Delta\varphi_{TXc}$ are all decreased by 10° (i.e., increased by 350°). That is, $$A_{TXi} \cdot \cos(\varphi_{TSG}[k] - \varphi_{TXi}) = A_{TXi} \cdot \cos(0 - (\varphi_{TXi} + \Delta\varphi_{TXi})), \quad (25)$$

if $\Delta\varphi_{TXi} = -\varphi_{TSG}[k]$ for all i=1, 2, . . . , n. In other words, the function of the phase shifter 106 may be provided in common by the phase shifters 105, and changing the phase value $\varphi_{TSG}[k]$ can have the same effect as changing the reference configuration, according to which the phase shift values $\Delta\varphi_{TX01}$, $\Delta\varphi_{TX02}$, . . . , $\Delta\varphi_{TXc}$ of phase shifters 105 are set. It is further noted that, although incrementing/decrementing the phase value $\varphi_{TSG}[k]$ is theoretically equivalent to simultaneously incrementing/decrementing all phase shift values $\Delta\varphi_{TX01}$, $\Delta\varphi_{TX02}$, . . . , $\Delta\varphi_{TXc}$ of the phase shifters 105, the first option may yield better results as the second option is more susceptible to potential mismatches between the phase shifters 105.

The method described above for measuring the amplitudes $A_{TXi}$ and the phases $\varphi_{TXi}$ of the RF output signals $s_{TXi}(t)$ of RF channels $TX_i$ is further summarized below with reference to the equation schemes in FIGS. 10A-10B, 11A-11B and the flow chart of FIG. 12. In case of c RF channels the index i runs from 1 to n. The equation schemes in FIGS. 10A-10B is a generalization of equations 8 to 10 and illustrates how the configuration, according to which the phase shift values $\Delta\varphi_{TXi}$ (supplied to phase shifters 105 in RF channels $TX_i$) are set, is changed during a measurement cycle k by inversion of one or more of the phase shift values $\Delta\varphi_{TXi}$. As mentioned above, the reference configuration (i.e., the initial setting of the phase shift values $\Delta\varphi_{TXi}$) and the phase $\varphi_{TSG}[k]$ of the RF reference signal $s_{TSG}(t)$ are constant during one measurement cycle (see FIG. 12, step S1).

Figure 12:
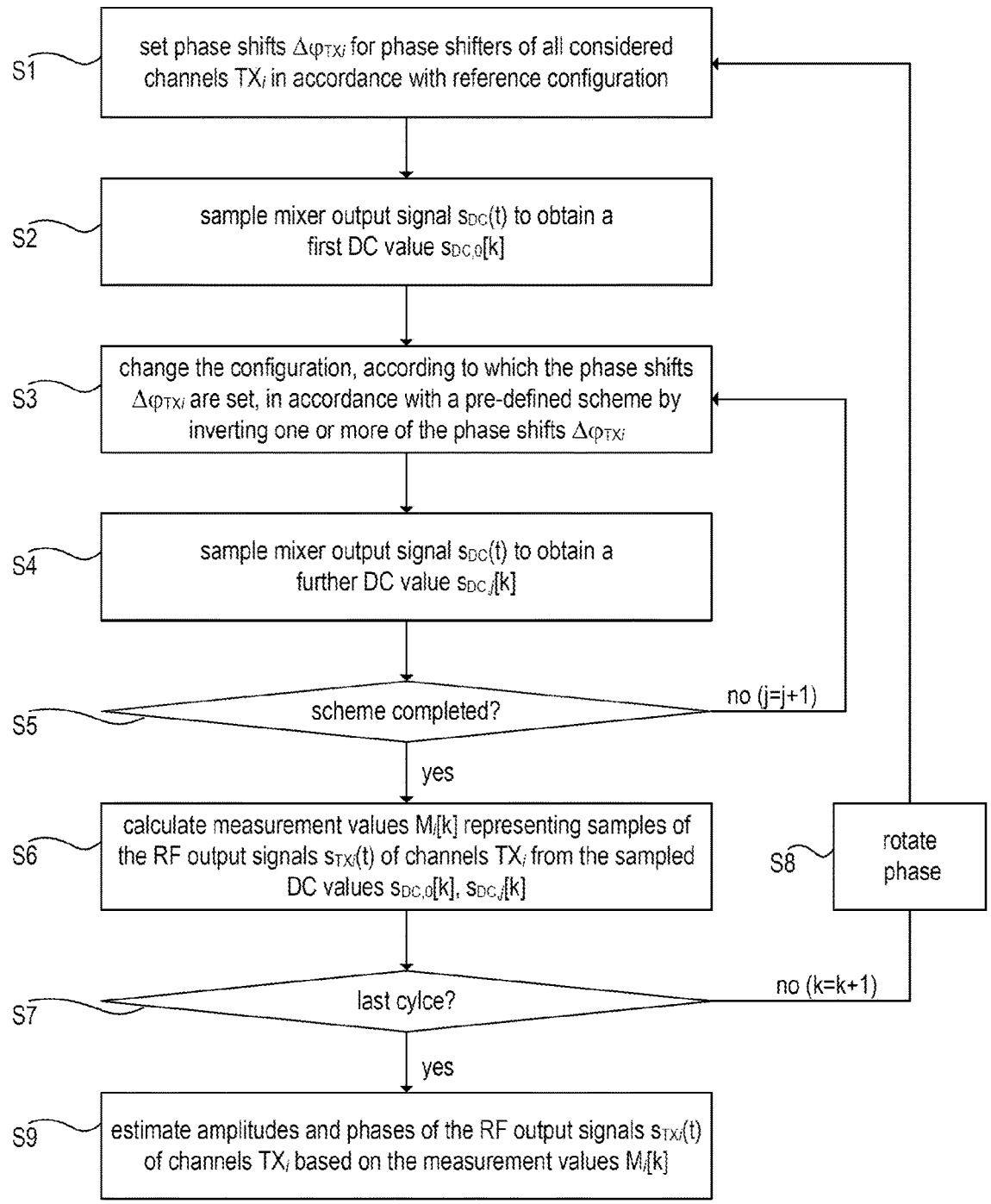
FIG. 12 is a flow chart illustrating one exemplary method for measuring amplitudes and phases of the RF output signals of different RF channels.

According to the scheme of FIG. 11A, the first DC value $s_{DC,0}[k]=s_{DC}(t_{k,0})$ of the mixer output signal $s_{DC}(t)$ is sampled at a reference configuration of the phase shift values $\Delta\varphi_{TXi}$ (see FIG. 12, step S2). As mentioned, without loss of generality, the reference configuration may be chosen such that all phase shift values $\Delta\varphi_{TXi}$ are zero. However, any other configuration may be used. Then, the configuration, according to which the phase shift values $\Delta\varphi_{TXi}$ are set, is modified in accordance with a pre-defined scheme by inversion of one or more of the phase shift values $\Delta\varphi_{TXi}$ (see FIG. 12, step S3), and a further DC value $s_{DC,1}[k]$ of the mixer output signal $s_{DC}(t)$ is sampled at the modified configuration (see FIG. 12, step S4). Inversion of a phase shift value may be accomplished by adding or subtracting π rad (180 degrees). As shown in FIG. 10A, all phase shift values $\Delta\varphi_{TXi}$ except $\Delta\varphi_{TX1}$ are inverted (increased/decreased by π) while sampling the DC value $s_{DC,1}[k]$, all phase shift values $\Delta\varphi_{TXi}$ except $\Delta\varphi_{TX2}$ are inverted while sampling the DC value $s_{DC,2}[k]$, and generally all phase shift values $\Delta\varphi_{TXi}$ except $\Delta\varphi_{TXj}$ are inverted while sampling the j-th further DC value $s_{DC,j}[k]$ (for j=1, . . . , c). The modification of the configuration and the sampling of DC values $s_{DC,j}[k]$ are repeated until the pre-defined scheme has been completely processed (see FIG. 12, step S5).

The sampled DC value $s_{DC,0}[k]$ and the further DC values $s_{DC,1}[k]$, . . . , $s_{DC,c}[k]$ are then used to calculate measurement values $M_i[k]$ representing samples of the RF output signals $s_{TXi}(t)$ of channels TXi (see FIG. 12, step S6, i=1, 2, . . . , c). These calculations are illustrated in FIG. 10B, which are a generalization of equations 17 and 18. Accordingly, for calculating the $i^{th}$ value $M_i[k]$ the sampled DC value $s_{DC,i}[k]$ is added to the first value $s_{DC,0}[k]$ (which is obtained for the reference configurations of the phase shift values $\Delta\varphi_{TXi}$). If the measurement is continued with the next cycle (see FIG. 12, step S7), the phase is rotated (see FIG. 12, step S8), which may be done by modifying the phase $\varphi_{TSG}[k]$ of the RF reference signal $s_{TSG}(t)$ (as illustrated in FIG. 7, third diagram), which is—as explained above—equivalent to changing the reference configuration, according to which the phase shift values $\Delta\varphi_{TXi}$ (supplied to phase shifters 105 in RF channels $TX_i$) are set, by equally modifying all phase shift values $\Delta\varphi_{TXi}$ (i=1, . . . , c) before any phase inversion is applied. The equivalence of these two options has been explained above with reference to equation 25.

If the measurement is completed after a defined number of cycles k, the measurement values $M_i[k]$ are used to estimate amplitudes $A_{TXi}$ and phases $\varphi_{TXi}$ of the RF output signals $s_{TXi}(t)$ of RF channels TXi (see FIG. 12, step S9). For example, after K measurement cycles have been run through, and if K is a power of two (k=0, . . . , K−1), amplitude $A_{TX01}$ and phase $\varphi_{TX01}$ can be estimated from the measured values $M_{01}[k]$ using an FFT algorithm, amplitude $A_{TX02}$ and phase $\varphi_{TX02}$ can be estimated from the measured values $M_{02}[k]$, etc.

According to the scheme shown in FIGS. 10A and 10B, all phase shift values $\Delta\varphi_{TX01}$, . . . , $\Delta\varphi_{TXc}$, except the j-th phase shift value $\Delta\varphi_{TXj}$, are inverted while sampling the j-th DC mixer output value $s_{DC,j}[k]$. As a result, the sampled DC values $s_{DC,j}[k]$ are added to $s_{DC,0}[k]$ to obtain the corresponding measured value $M_j[k]$. FIGS. 11A and 11B illustrate an alternative scheme, which is equivalent. In accordance with FIG. 11A, the phase shift values $\Delta\varphi_{TX01}$, . . . , $\Delta\varphi_{TXc}$ are unchanged (as compared to the reference configuration) and are not inverted, except the j-th phase shift value $\Delta\varphi_{TXj}$, which is the only phase shift value that is inverted while sampling the j-th DC mixer output value $s_{DC,j}[k]$. As a result, as shown in FIG. 11B, the sampled DC values $s_{DC,j}[k]$ are subtracted from $s_{DC,0}[k]$ to obtain the corresponding measured value $M_j[k]$. The equivalence of the two schemes has already been mentioned in connection with equation 16. As a consequence of this equivalence, the two approaches of FIGS. 10A, 10B, 11A, and 11B can be mixed, resulting in further schemes which are also equivalent. In the case of only two channels TX01 and TX02 the two approaches are theoretically identical (when neglecting tolerances and measurement errors), which makes one measurement redundant (cf. equations 15 and 16).

The described embodiments implement a concept that allows the monitoring of phase and/or signal amplitude of the output signals of multiple RF channels; and the monitoring allows an assessment whether the phases and/or amplitudes are balanced. In this context "balanced phases" means that the phases of the RF channel output signals are equal or differ by predefined values. Phase balancing may be important when using phased array antennas or beam forming techniques. Similarly, amplitude balancing, usually means that the amplitudes of the RF channel output signals are equal or correspond to defined values. If the RF channels are out of balance, the control circuit (or any other circuitry coupled thereto) may initiate counter measures to bring the RF channels into balance. It is noted that the concepts described above may be implemented on-chip, i.e., the monitor circuit as well as supplementary circuitry may be implemented on the same chip as the RF channels (e.g., the MMIC).

As mentioned above, an FFT algorithm may be used to determine the sought amplitudes and phases from the measured values $M_{01}[k]$, $M_{02}[k]$, . . . , $M_c[k]$ Alternatively, a specific implementation of a Discrete Fourier Transform (DFT) may be used as discussed below. As shown for example in FIGS. 6 and 7, the phase rotation may be done by modifying the phase $\varphi_{TSG}[k]$ of the RF reference signal $s_{TSG}(t)$ by constant increments (see FIGS. 6 and 7). In case the phase rotation covers an integer multiple of $2\pi$ (e.g., 360°), the sought amplitude and phase information is included in a single frequency bin of the discrete spectrum.

For example, in case the phase $\varphi_{TSG}[k]$ is rotated in steps of 90° in four measurement cycles (i.e., $\varphi_{TSG}[0]=0$, $\varphi_{TSG}=\pi/2$, $\varphi_{TSG}[2]=\pi$, and $\varphi_{TSG}[3]=3\pi/2$), then the measurement values $M_{01}[0]$, . . . , $M_{01[3]}$ (for the first channel TX01) are distributed exactly over one period $[0, 2\pi[$, and all frequency bins (discrete frequency values) of the discrete spectrum of the measurement values $M_{01}[k]$ will be substantially zero except the second bin with index n=1. If no noise is present the other frequency bins will be exactly zero. Similarly, in case the phase $\varphi_{TSG}[k]$ is rotated in steps of 90° in eight measurement cycles (i.e., $\varphi_{TSG}[0]=0$, $\varphi_{TSG}[1]=\pi/2$, $\varphi_{TSG}[2]=\pi$, and $\varphi_{TSG}[3]=3\pi/2$, $\varphi_{TSG}[4]=\pi$, $\varphi_{TSG}[5]=5\pi/2$. $\varphi_{TSG}[6]=3\pi$, $\varphi_{TSG}[7]=7\pi/2$), then the measurement values $M_{01}[0]$, . . . , $M_{01}[7]$ cover exactly two periods $[0, 4\pi[$, and all frequency bins (discrete frequency values) of the discrete spectrum of measurement values $M_{01}[k]$ will be substantially zero except the third bin with index n=2. Accordingly, it is sufficient to process only the non-zero frequency bins for obtaining the sought information about the phase, amplitude (and thus signal power). This results in reduced power consumption and faster estimation of the above parameters since only one spectral value has to be calculated instead of the whole discrete spectrum. It is noted that a spectral value may indicate an amplitude and phase for a specific frequency component of the sequence including the sampled values. For example, for the sampled values shown in FIGS. 14 and 15, the spectral value corresponds to the phase and the amplitude of the sinusodial waveform shown in the respective diagrams.

To further analyze the concept described herein, the discrete Fourier transform of the sequence $M_c[k]$ (measured values for the c-th channel) is considered:

$$Y[n] = \sum_{k=0}^{N-1} M_c[k] \cdot W_N^{k \cdot n}, \tag{26}$$

wherein the complex weight factor $W_N$ is defined as (j being the imaginary unit)

$$W_N = e^{-j2\pi/N}. \tag{27}$$

If the phase rotation of the phase $\varphi_{TSG}[k]$ covers one full rotation (i.e., the interval $[0, 2\pi)$ in N steps of $2\pi/N$, then the sought information is in the second frequency bin, i.e., in Y[1]. At this point it is noted that the first frequency bin Y[0] includes the DC-Offset of the sequence $M_c[k]$ which is substantially zero. As indicate above, if the phase rotation of the phase $\varphi_{TSG}[k]$ is distributed over two full rotation (i.e., the interval [0, 4π[) in N steps of 4π/N, then the sought information is in the third frequency bin, i.e., Y[2]. If the phase rotation covers three full rotations, then the sought information is in the fourth frequency bin Y[3], etc.

For the following explanations, it is assumed that the rotation of the phase $\varphi_{TSG}[k]$ covers one full rotation in N steps of 2π/N and the frequency bin of interest is the second frequency bin n=1. In this example, the spectral value Y[1] of the second frequency bin can be calculated as follows:

$$Y[1] = \sum_{k=0}^{N-1} M_c[k] \cdot W_N^k = M_c^T \cdot W_N \qquad (28)$$

wherein $M_c$ denotes a vector including the sequence $M_c[k]$ and $W_N$ denotes a vector including the weights $W_N^k$ (for k=0, 1, . . . , N−1). That is:

$$M_c = \begin{pmatrix} M_c[0] \\ \vdots \\ M_c[N-1] \end{pmatrix} \text{ and } W_N = \begin{pmatrix} W_N^0 \\ \vdots \\ W_N^{N-1} \end{pmatrix}. \qquad (29)$$

In equation 28, the superscript T denotes the transposed. It can be observed that the Discrete Fourier Transform may be replaced by the vector multiplication of equation 29.

In accordance with one example, the parameter N may be chosen as eight (N=8) for phase increments of 2π/8 (i.e., 45°), which means that eight measurement cycles are performed to obtain the eight measured values $M_c[0]$, . . . , $M_c[7]$ for each channel TXc. In this example, the resulting weight vector $W_8$ has a simple structure, namely $$W_8 = \begin{pmatrix} 1 \\ \sqrt{2} - j\sqrt{2} \\ -j \\ -\sqrt{2} - j\sqrt{2} \\ -1 \\ -\sqrt{2} + j\sqrt{2} \\ j \\ \sqrt{2} + j\sqrt{2} \end{pmatrix}. \qquad (30)$$

In accordance with another example, the parameter N may be chosen as four (N=4) for phase increments of 2π/4 (i.e., 90°), which means that four measurement cycles are performed to obtain the four measured values $M_c[0]$, . . . , $M_c[4]$ for each channel c. In this example, the resulting weight vector $W_4$ has an even simpler structure, namely $$W_4 = \begin{pmatrix} 1 \\ -j \\ -1 \\ j \end{pmatrix}. \qquad (31)$$

It is noted, that in the latter example (equation 31) no multiplication have to be performed, and the spectral value Y[1] of the first frequency bin n=1 may be obtained by two simple additions/subtractions. That is, for each channel TXc:

$$Y[1] = M_c^T \cdot W_4 = \underbrace{M_c[0] - M_c[2]}_{Re\{Y[1]\}} + j \cdot \underbrace{(M_c[3] - M_c[1])}_{Im\{Y[1]\}}. \qquad (32)$$

In the above equation 32, Re{·} and Im{·} denote the real and the imaginary part of the complex-valued spectral value Y[1]. The sought amplitude value $2A_{TXc}$ of the sequence $M_c[k]$ (see equations 24) can be determined from the magnitude of the spectral value Y[1], namely |Y[1]|, and the corresponding phase value $\varphi_{TXc}$ (for channel TXc) can be calculated using the following known relations:

$$2A_{TXc} = \frac{2}{N}|Y[1]| = \frac{2}{N}\sqrt{Re\{Y[1]\}^2 + Im\{Y[1]\}^2} \qquad (33)$$

$$\varphi_{TXc} = \tan^{-1}(Im\{Y[1]\}/Re\{Y[1]\}). \qquad (34)$$

It is noted, that in a general case N complex-valued multiplications and N−1 complex-valued additions are needed to calculate the spectral value Y[1] wherein each complex-valued multiplication entails two real-valued multiplications and two real-valued additions. As discussed above, the number of calculations significantly reduces for specific values of N. Particularly for N=4. the calculations become trivial and only two real-valued additions remain for calculating the spectral value Y[1] (see equation 32). Although a sequence $M_c[k]$ of only four values (i.e., N=4 and k=0, . . . , 3) may be sufficient to estimate the phase value for a channel, a longer sequence (e.g., N=8) with more values may yield better (more precise) results. As shown in equation 30, the values in the weight vector $W_N$ are not trivial for higher parameters N (as compared to the case N=4). In the case of N=8 the factor √2 may be stored in a memory as a pre-calculated numerical value. For higher values of the parameter N (N>8), more factors need to be pre-calculated and stored.

The complexity of the amplitude and phase estimation also for higher values of N may be achieved when covering two or more full rotations of the phase. If, in accordance with a further example, the parameter N is chosen as eight (N=8) for phase increments of 4π/8 (i.e., 90°), the phases are distributed over two full rotations, i.e., two full rotations are covered. Accordingly, eight measurement cycles are performed to obtain the eight measured values $M_c[0]$, . . . , $M_c[7]$ for each channel TXc. In this example, the spectral value Y[2] is relevant, $$Y[2] = \sum_{k=0}^{8-1} M_c[k] \cdot W_8^{2 \cdot k} = M_c^T \cdot W_8, \qquad (35)$$

and the resulting weight vector $W_8$ has a simple structure, namely $$W_8 = \begin{pmatrix} W_8^0 \\ W_8^2 \\ W_8^4 \\ W_8^6 \\ W_8^8 \\ W_8^{10} \\ W_8^{12} \\ W_8^{14} \end{pmatrix} = \begin{pmatrix} 1 \\ -j \\ -1 \\ j \\ 1 \\ -j \\ -1 \\ j \end{pmatrix}. \qquad (36)$$

For N=16 and increments of $8\pi/16$, four full rotations of the phase are performed and the relevant spectral value is Y[4], wherein the corresponding weight vector $W_{16}$ remains trivial, i.e., $W_{16}=[W_N^{4 \cdot k}]$.

Summarizing the above, calculation of the whole spectrum, e.g., using an FFT algorithm, may be avoided if the measured sequence covers an integer multiple of a full phase rotation (a full rotation means a rotation of $2\pi$ or 360°). That is, for a sequence of N values (obtained in N measurement cycles) the phase increment between the samples is an integer multiple of $2\pi/N$. If the measurements are distributed over one full phase rotation, the second frequency bin Y[1] is relevant (Y[0] represents the DC offset and is ideally zero). Generally, if the measurements are distributed over u full phase rotations, frequency bin u is relevant, i.e., Y[u] is relevant. As mentioned the frequency bin Y[0] represents a DC offset which is ideally zero. The weight vector $W_N$ becomes trivial, if the phase increments between the samples equal $\pi/2$ (90°). In both cases, the calculations needed to determine the spectral value of the sought frequency bin can be very efficiently implemented in hardware with less complexity than conventional FFT algorithms. In one example, a hardware-implemented CORDIC algorithm is used.

Figure 13:
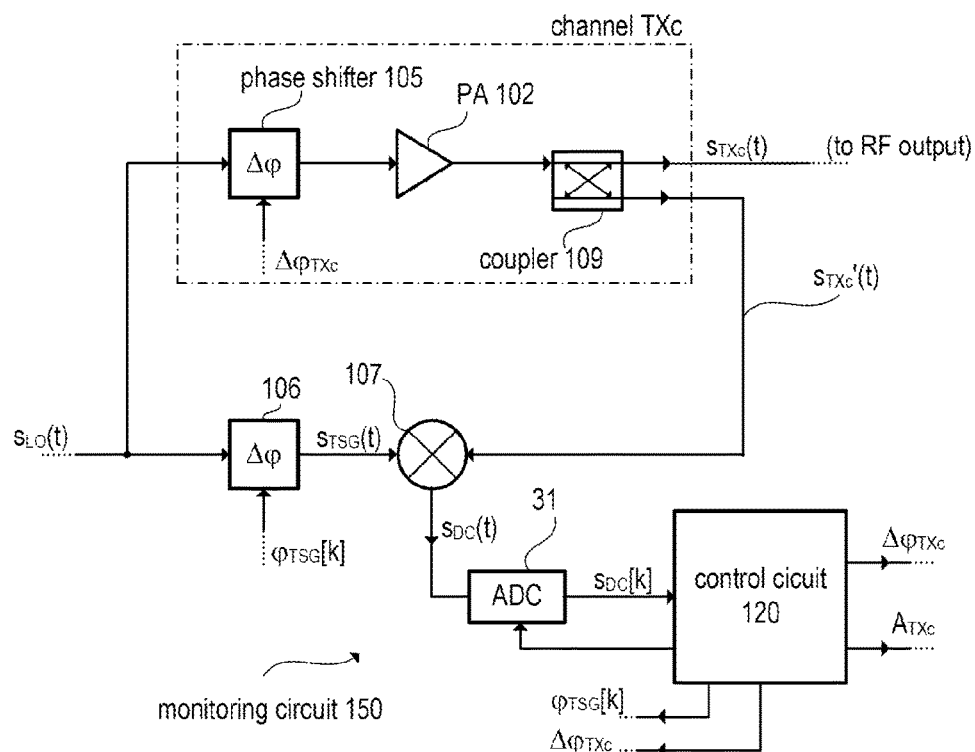
FIG. 13 is a block diagram illustrating another example of a monitor circuit that may be used to successively sense the phase lags and gains caused by two or more RF channels of an RF circuit.

It is noted, that the herein-described approach for estimating phase and amplitude of sinusoid sequences—such as the sequences $M_{01}[k]$, $M_{02}[k]$, etc.—that cover an integer number of periods (i.e., an integer number of full phase rotations) may not only be applied in a system shown in FIGS. 5, 8, and 9, but can also be applied in other systems, in which the phases of the individual channels are measured subsequently (channel-wise). An example of such a system is illustrated in FIG. 13.

Accordingly, the approach explained above with reference to equations 26 to 36 is not limited to examples in which the RF output signals from multiple channels are combined as described above with reference to FIGS. 5 to 19. The approach can generally be used to evaluate phases and amplitude values of signals having sinusoidal waveforms (such as, e.g., $M_{01}[k]$, $M_{02}[k]$, etc.). FIG. 13 illustrates a block diagram illustrating one further example of an RF circuit with multiple RF channels for generating multiple RF output signals. Only one channel TXc of c channels is depicted to keep the illustration simple. Similar as in the example of FIG. 8, the local oscillator signal $s_{LO}(t)$ is supplied as input signal to the RF channel TXc as well as to the monitor circuit 150. As in the previous examples, the RF channel TXc includes a phase shifter 105 (phase shift $\Delta\varphi_{TXc}$) and an amplifier 102 in order to phase-shift and amplify the local oscillator signal $s_{LO}(t)$. The phase-shifted and amplified signal $s_{TXc}(t)$ is supplied as output signal at an output port of the RF channel TXc, wherein a coupler 109 is included in the RF channel TXc configured to provide a fraction of the output signal $s_{TXc}(t)$ as scaled output signal $s_{TXc}'(t)$ to the monitor circuit 150 for the determination of the phase and the amplitude of the output signal $s_{TXc}(t)$. The scaled output signal is denoted as $s_{TXc}'(t)$ and has a fraction of the signal power of the output signal $s_{TXc}(t)$.

The monitor circuit 150 includes a phase shifter 106 (phase shift $\Delta\varphi_{TSG}$), which is configured to phase shift the local oscillator signal $s_{LO}(t)$. The output signal is denoted as reference signal $s_{TSG}(t)$ (see equation 5). The monitor circuit 150 further includes mixer 107 that is configured to mix the reference signal $s_{TSG}(t)$ with the (scaled) output signal $s_{TXc}'(t)$. As both signals $s_{TSG}(t)$ and $s_{TXc}'(t)$ have the same frequency $f_{LO}$, the output signal of the mixer 107 is a DC-signal $s_{DC}(t)$, which represents the phase of the output signal $s_{TXc}(t)$ relative to the phase of the reference signal $s_{TSG}(t)$. Analogously to equation 1, the output signal $s_{TXc}(t)$ can be written as:

$$s_{TXc} = A_{TXc} \cdot \cos(2\pi f_{LO} t + \varphi_{TXc} + \Delta\varphi_{TXc}), \qquad (37)$$

wherein $\Delta\varphi_{TXc}$ is the phase shift caused by phase shifter 105 and $\varphi_{TXc}$ is the phase shift caused by further circuit components in the signal path from the local oscillator to the output of the RF channel TXc. $A_{TXc}$ denotes the amplitude of the output signal $s_{TXc}(t)$. Similar to equations 6 and 7, the mixer output signal $s_{DC}(t)$ can be calculated as follows:

$$s_{DC}(t) \approx A_{TXc} \cdot \cos(\varphi_{TSG} - \Delta\varphi_{TXc} - \varphi_{TXc}). \qquad (38)$$

It is to be noted that only one output channel is active in the present example, while the other channels are inactive and not generating an RF output signal.

The analog signal DC may be sampled (e.g., by ADC 31) at various different phase shift values $\varphi_{TSG}$ and $\Delta\varphi_{TXc}$ set by the phase shifters 106 and 105, respectively. The k-th sample of the resulting discrete sequence $M_c[k]$ is $$M_c[k] = s_{DC}(t_k) = s_{DC}[k] \approx A_{TXc} \cdot \cos\left(\underbrace{\varphi_{TSG}[k] - \Delta\varphi_{TXc}[k]}_{\Delta\varphi_c[k]} - \varphi_{TXc}\right). \qquad (39)$$

The sequence $M_c[k]$ may herein be referred to as measured signal, wherein the phase difference $\varphi_{TSG}[k]-\Delta\varphi_{TXc}[k]$ may herein be referred to as phase offset $\Delta\varphi_c[k]$. It is noted that the phase offset $\Delta\varphi_c[k]$ can be set solely by the phase shifters 105 and 106, which may be controlled by control circuit 120.

If the phase offset $\Delta\varphi_c[k]$ is successively rotated by equidistant phase steps, the measured sequence $M_c[k]$ is a discrete sinusoidal signal similar to the signals shown in the example of FIG. 6. If the size of one phase step is an integer multiple of $2\pi/N$, wherein N is the number of measurement cycles and thus the number of samples in the sequence $M_c[k]$ (i.e., k=0, . . . , N-1), the measured sequence $M_c[k]$ is distributed over one or more full periods (i.e., full phase rotations of $2\pi$).

Figure 14A:
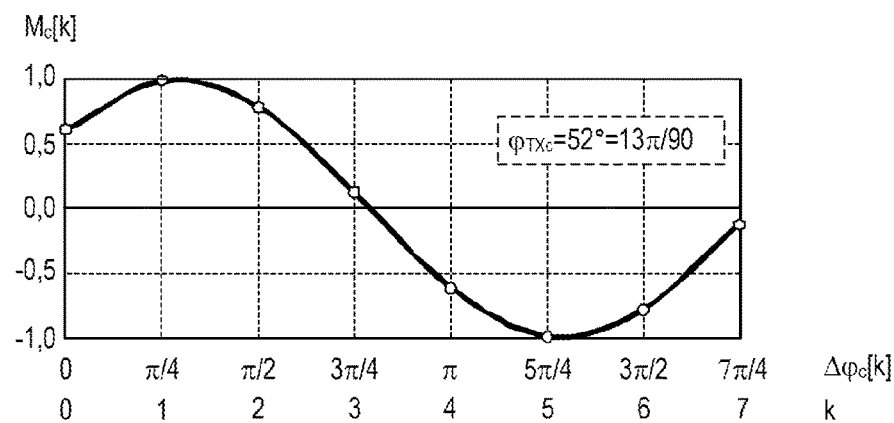
FIGS. 14A and 14B include diagrams illustrating a first example of a sequence of measured values and corresponding weight factors used for calculating a corresponding spectral value.
Figure 14B:
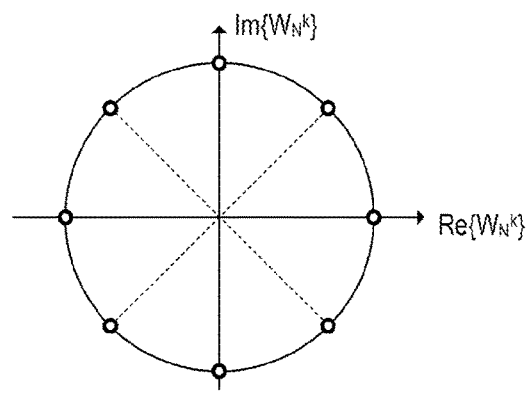

FIG. 14A illustrates a first example of a sequence of measured values and FIG. 14B illustrates corresponding weight factors used for calculating a corresponding spectral value. FIG. 15A illustrates a second example of a sequence of measured values and FIG. 15B illustrates corresponding weight factors used for calculating a corresponding spectral value.

FIG. 14A illustrates a measured sequence $M_c[k]$ with eight samples (i.e., k=0, . . . , N-1), wherein these samples can be regarded as elements of the vector $M_c$ (see equation 28). For a successive, next measurement cycle the phase offset $\Delta\varphi_c[k]$ is increased by $2\pi/N=\pi/4$ (i.e., 45°). In the depicted example, the determined phase $\varphi_{TXc}$ is $13\pi/90$ (i.e., 52°). As can be seen from FIG. 14A, one full period of a cosine sequence is obtained, and thus the relevant phase and amplitude information is in the second frequency bin Y[1] (frequency index n=1) of the corresponding discrete Fourier Transform as explained above.

Considering equations 27 and 30, the weight factor $W_8^k$ equals $e^{-j \cdot k \cdot \pi/4}$. The complex values of $W_8^k$ are illustrated in FIG. 14B for k=0, . . . 7. The depicted values are the elements of the weight vector $W_8$ defined in equation 30. The spectral value Y[1] can be calculated in accordance with equation 28, and an estimation for the sought phase $\varphi_{TXc}$ value can be calculated from the spectral value Y[1] in accordance with equation 34. The corresponding amplitude can be calculated from the spectral value Y[1] in accordance with equation 33.

According to one implementation, the phase offset $\Delta\varphi_c[k]$ is stepwise rotated to cover one or more full rotations of $2\pi$ (i.e., 360°) and thus the step size is an integer multiple of $2\pi/N$, wherein N is the number of samples (measurement cycles). As defined in equation 39, the phase offset $\Delta\varphi_c[k] = \varphi_{TSG}[k] - \Delta\varphi_{TXc}[k]$ can be determined by both phase shifters 105 and 106. Therefore, a phase offset of $\pi/4$ can be obtained by setting the phase shifter 106 to $\varphi_{TSG}[k] = \pi/4$ and the phase shifter 105 to $\Delta\varphi_{TXc}[k] = 0$. However, the same phase shift may be obtained by setting the phase shifter 106 to $\varphi_{TSG}[k] = \pi/2$ and the phase shifter 105 to $\Delta\varphi_{TXc}[k] = \pi/4$. In some implementations, both phase shifts $\varphi_{TSG}[k]$ and $\Delta\varphi_{TXc}[k]$ may be varied for setting a specific phase offset $\Delta\varphi_c[k]$ in order to test the functionality of both phase shifters 105 and 106. In other words, if the measured sequence $M_c[k]$ corresponds to the expected sinusoidal samples, it can be determined that both phase shifters 105 and 106 provide the expected phase offsets and are functioning and operating correctly.

FIG. 15A illustrates another example of a measured sequence $M_c[k]$ with eight samples (i.e., k=0, ..., N−1), wherein these samples can be regarded as elements of the vector $M_c$ (see equation 35). Between two successive measurement cycles the phase offset $\Delta\varphi_c[k]$ has been increased by $4\pi/N = \pi/2$ (i.e., 90°). Like in the previous example, the sought phase $\varphi_{TXc}$ is $13\pi/90$ (i.e., 52°). As can be seen from FIG. 15A, two full periods of a cosine sequence are obtained, and thus the relevant phase and amplitude information is in the third frequency bin Y[2] (frequency index n=2) of the corresponding discrete Fourier Transform as explained above. Considering equations 27 and 35, the weight factor $W_8^{2k}$ equals $e^{-j \cdot k \cdot \pi/2}$. Again, the complex values of $W_8^{2k}$ are illustrated in FIG. 15B for k=0, ... 7. The depicted values are the elements of the weight vector $W_8$ defined in equation 36. The spectral value Y[2] can be calculated in accordance with equation 35, and an estimation for the sought phase $\varphi_{TXc}$ value can be calculated from the spectral value Y[2] in view of equation 34. The corresponding amplitude can be calculated from the spectral value Y[12] in view of equation 33.

It is noted that the example illustrated in FIGS. 15A and 15B uses the same number of samples to estimate phase and amplitude of the measured sequence $M_c[k]$ as in the previous example of FIGS. 14A and 14B. However, the weight vector $W_8$ takes a more simple form in the example of FIGS. 15A and 15B (see equation 36) as already discussed above. This is due to the fact that the step size of the phase offset $\Delta\varphi_c[k]$ equals $\pi/2$ and the cosine of integer multiples of $\pi/2$ can only assume the values 0, 1, and −1. Accordingly, the elements of the weight vector $W_8$ have imaginary and real parts that are either or 1 or −1.

As mentioned above, a specific phase offset $\Delta\varphi_c[k]$ can be set using both phase shifters 105 and 106. The tables shown in FIGS. 16 and 17 illustrates two different settings for the phase shifters 105 and 105 to obtain equally spaced phase offsets $\Delta\varphi_c[k]$ when successively acquiring measured values $M_c[k]$ in accordance with the approach shown in FIG. 15A. In the example of FIG. 16, the phase shift $\Delta\varphi_{TXc}[k]$ generated by phase shifter 105 remains zero, while the phase rotation is solely accomplished by phase shifter 106 that increases the phase shift $\Delta\varphi_{TSG}[k]$ stepwise by $\pi/2$ (i.e., 90°). Thus, the phase offset $\Delta\varphi_c[k]$ is rotated by two full rotations while obtaining a sequence $M_c$ of eight measured values $M_c[k]$ (for k=0, ..., 7). In another example the phase shift $\Delta\varphi_{TXc}[k]$ generated by phase shifter 105 is set to zero while obtaining the first four measurements $M_c[k]$ (for k=0, ..., 3) and set to $\pi/4$ (i.e., 45°) while obtaining the remaining measurements $M_c[k]$ (for k=4, ..., 7). At the same time, the phase shift $\Delta\varphi_{TSG}[k]$ generated by the phase shifter 106 is stepwise increased by $\pi/2$—starting at zero—while obtaining the first four measurements $M_c[k]$ (for k=0, ..., 3) and stepwise increased by $\pi/2$—starting at $\pi/4$—while obtaining the remaining measurements $M_c[k]$ (for k=4, ..., 7). This situation is illustrated in FIG. 17. It is understood that phase offsets of $2\pi$ (i.e., 360°) and integer multiples of $2\pi$ correspond to a phase offset of zero. Accordingly, a subtraction $\Delta\varphi_c[k] = \Delta\varphi_{TSG}[k] - \Delta\varphi_{TXc}[k]$ resulting in $\psi \pm 2\pi$ is identical to a subtraction $\Delta\varphi_c[k] = \Delta\varphi_{TSG}[k] - \Delta\varphi_{TXc}[k]$ resulting in $\psi$ (wherein $\psi$ may by an arbitrary angle).

Additionally, further embodiments are provided below:

Embodiment 1: A method includes receiving a radio frequency (RF) oscillator signal; providing the RF oscillator signal to a plurality of RF channels of an RF circuit, each RF channel generating an RF output signal of a plurality of RF output signals based on the RF oscillator signal, and each RF output signal having an amplitude and a phase; generating a combined signal representing a combination of the RF output signals; down-converting the combined signal using an RF reference signal supplied to a mixer to generate a down-converted signal, a mixer output signal being the down-converted signal; and processing the mixer output signal to obtain estimated values indicative of amplitudes and/or phases of the plurality of RF output signals.

Embodiment 2: The method of embodiment 1, wherein each RF channel of the plurality of RF channels includes a phase shifter that receives a respective phase shift value associated with a respective RF channel of the plurality of RF channels, wherein the phase of each RF output signal depends on the respective phase shift value. In addition, processing the mixer output signal includes: configuring each respective phase shift value by setting each respective phase shift value in accordance with a first phase configuration; modifying a phase configuration, according to which each respective phase shift value is set to establish different modified configurations of phase shift values; and sampling the mixer output signal for the first phase configuration and for the different modified configurations of the phase shift values to generate a set of sampled mixer output values.

Embodiment 3: The method of embodiment 2, wherein modifying the phase configuration includes: changing or inverting one or more of the phase shift values in accordance with a predefined scheme.

Embodiment 4: The method of embodiment 2 or 3, wherein processing the mixer output signal further includes: combining two or more sampled mixer output values of the set of sampled mixer output values to obtain measured values, each measured value depending on the amplitude and the phase of the RF output signal of a specific RF channel.

Embodiment 5: The method of any of embodiments 2-4, wherein processing the mixer output signal further includes recurrently: changing a phase of the RF reference signal or change the first phase configuration of the phase shift values; and repeating a modification of the phase configuration, according to which the phase shift values are set, and a triggering of a sampling of the mixer output signal to generate a further set of sampled mixer output values.

Embodiment 6: A method comprises providing a radio frequency (RF) test signal to a radar transmitter circuit; mixing an RF reference signal and an RF test signal that represents an RF output signal of the radar transmitter circuit to generate a mixer output signal; repeatedly selecting a phase offset from a sequence of phase offsets, applying the selected phase offset by phase-shifting at least one of the RF test signal and the RF reference signal, and sampling the mixer output signal to generate a sequence of sampled values associated with the sequence of phase offsets; calculating a spectral value from the sequence of sampled values; and calculating estimated phase information indicating a phase of the RF output signal based on the spectral value.

Embodiment 7: The method of embodiment 6, wherein calculating the estimated phase information comprises: calculating the spectral value from the sequence of sampled values, the spectral value being a complex valued spectral value; and calculating an argument of the complex-valued spectral value, the argument being the estimation of the phase of the RF output signal.

Embodiment 8: The method of embodiment 6 or 7, wherein the sequence of phase offsets is a sequence of equally spaced phases distributed over one or more full phase rotations.

Embodiment 9: The method of embodiment 8, further comprising: providing a sequence of weight factors, wherein the weight factors depend on a number of periods in the sequence of sampled values and on a length of the sequence of sampled values.

Embodiment 10: The method of any of the embodiments 6-9, wherein phase offsets included in the sequence of phase offsets are equally spaced with a spacing of 90 degrees and a length of the sequence of phase offsets is an integer multiple of four.

Embodiment 11: The method of any of the embodiments 6-9, wherein phase offsets included in the sequence of phase offsets are equally spaced with a spacing that equals an integer multiple of 360 degrees divided by a length of the sequence of phase offsets.

Embodiment 12: The method of any of the embodiments 6-11, wherein applying the selected phase offset comprises: using a first phase shifter to phase-shift the RF test signal by a first phase shift value; and using a second phase shifter to phase-shift the RF reference signal by a second phase shift value, wherein the selected phase offset corresponds to a difference between the second phase shift value and the first phase shift value.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond unless otherwise indicated to any component or structure, which performs the specified function of the described component (e.g., that is functionally equivalent), even though not structurally equivalent to the disclosed structure, which performs the function in the herein illustrated exemplary implementations of the invention.

What is claimed is:

1. A circuit, comprising:
    a radio frequency (RF) transmitter channel including an input node and an output node and being configured to receive an RF oscillator signal at the input node and to provide an RF output signal at the output node, wherein the output node is configured to be coupled to a transmit antenna;
    a monitor circuit including a mixer configured to mix an RF reference signal and an RF test signal that represents the RF output signal to generate a mixer output signal, wherein the monitor circuit includes a coupler coupled to the RF transmitter channel and configured to couple out a portion of the RF output signal to generate the RF test signal;
    an analog-to-digital converter configured to sample the mixer output signal at a plurality of sampling times in order to provide a sequence of sampled values; and
    a control circuit coupled to the analog-to-digital converter and configured to:
        provide a sequence of phase offsets by phase-shifting at least one of the RF test signal or the RF reference signal using one or more phase shifters such that a phase offset between the RF test signal and the RF reference signal is successively increased according to the sequence of phase offsets,
            wherein the analog-to-digital converter is configured to sample the mixer output signal for each phase offset of the sequence of phase offsets to provide the sequence of sampled values,
        calculate a spectral value of the sequence of sampled values, and
        calculate estimated phase information indicating a phase of the RF output signal based on the spectral value.

2. The circuit of claim 1, wherein the monitor circuit further comprises:
    a phase shifter coupled to the mixer and configured to receive the RF oscillator signal and generate the RF reference signal by applying a selected phase shift to the RF oscillator signal, thereby determining a phase of the RF reference signal used by the mixer, wherein the phase shifter is configured to provide the RF reference signal to the mixer.

3. The circuit of claim 2, wherein an input of the phase shifter is coupled to the input node of the RF channel.

4. The circuit of claim 2, wherein the phase shifter is configured to receive the RF oscillator signal and apply the sequence of phase offsets to the RF oscillator signal to generate the RF reference signal having the sequence of phase offsets with respect to the RF oscillator signal.

5. The circuit of claim 4, wherein the phase shifter is configured to apply the sequence of phase offsets to the RF oscillator signal to generate the RF reference signal by changing the selected phase shift applied to the RF oscillator signal in equidistant phase steps.

6. The circuit of claim 1, wherein the sequence of sampled values are direct current (DC) values corresponding to the sequence of phase offsets of the RF reference signal.

7. The circuit of claim 1, wherein the RF channel includes a phase shifter coupled to and arranged between the input node and the output node,
    wherein the phase shifter is configured to receive the RF oscillator signal and generate the RF output signal by applying a selected phase shift to the RF oscillator signal, thereby determining a phase of the RF output signal used by the mixer.

8. The circuit of claim 7, wherein the phase shifter is configured to receive the RF oscillator signal and apply the sequence of phase offsets to the RF oscillator signal to generate the RF output signal having the sequence of phase offsets with respect to the RF oscillator signal.

9. The circuit of claim 8, wherein the phase shifter is configured to apply the sequence of phase offsets to the RF oscillator signal to generate the RF output signal by changing the selected phase shift applied to the RF oscillator signal in equidistant phase steps.

10. The circuit of claim 8, wherein the sequence of sampled values are direct current (DC) values corresponding to the sequence of phase offsets of the RF output signal.

11. The circuit of claim 1, wherein the RF test signal and the RF reference signal provided to the mixer have a same frequency.

12. A method, comprising:
providing a radio frequency (RF) test signal to a radar transmitter circuit;
mixing an RF reference signal and an RF test signal that represents an RF output signal of the radar transmitter circuit to generate a mixer output signal;
repeatedly selecting a phase offset according to a sequence of phase offsets;
applying each selected phase-offset according to the sequence of phase offsets by phase-shifting at least one of the RF test signal or the RF reference signal such that a phase offset between the RF test signal and the RF reference signal is successively increased to generate the sequence of phase offsets;
sampling the mixer output signal a plurality of times to generate a sequence of sampled values associated with the sequence of phase offsets, wherein sampling the mixer output signal include sampling the mixer output signal for each phase offset of the sequence of phase offsets to provide the sequence of sampled values;
calculating a spectral value from the sequence of sampled values; and
calculating estimated phase information indicating a phase of the RF output signal based on the spectral value.

13. The method of claim 12, wherein calculating the estimated phase information comprises:
calculating the spectral value from the sequence of sampled values, the spectral value being a complex-valued spectral value; and
calculating an argument of the complex-valued spectral value, the argument being an estimation of the phase of the RF output signal.

14. The method of claim 12, wherein the sequence of phase offsets is a sequence of equally spaced phases distributed over one or more full phase rotations.

15. The method of claim 14, the method further comprising:
providing a sequence of weight factors,
wherein the weight factors depend on a number of periods in the sequence of sampled values and on a number of sampled values of the sequence of sampled values.

16. The method of claim 12, wherein phase offsets included in the sequence of phase offsets are equally spaced with a spacing of 90 degrees and a number of phase offsets of the sequence of phase offsets is an integer multiple of four.

17. The method of claim 12, wherein phase offsets included in the sequence of phase offsets are equally spaced with a spacing that equals an integer multiple of 360 degrees divided by a number of phase offsets of the sequence of phase offsets.

18. The method of claim 12, wherein applying each selected phase offset according to the sequence of phase offsets comprises:
using a first phase shifter to phase-shift the RF test signal by a first phase shift value; and
using a second phase shifter to phase-shift the RF reference signal by a second phase shift value, wherein each selected phase offset corresponds to a difference between the second phase shift value and the first phase shift value.

19. A method, comprising:
providing an RF oscillator signal at an input node of an RF channel;
generating an RF output signal at an output node of the RF channel based on the RF oscillator signal;
mixing an RF reference signal and an RF test signal that represents the RF output signal to generate a mixer output signal;
generating a sequence of phase offsets corresponding to a plurality of sampling times by repeatedly phase-shifting at least one of the RF test signal or the RF reference signal using one or more phase shifters such that a phase offset between the RF test signal and the RF reference signal is successively increased according to the sequence of phase offsets;
sampling the mixer output signal at the plurality of sampling times in order to generate a sequence of sampled values, wherein each sampled value of the sequence of sampled values corresponds to a respective phase offset of a sequence of phase offsets;
calculating a spectral value from the sequence of sampled values; and
calculating estimated phase information indicating a phase of the RF output signal based on the spectral value.

20. The method of claim 19, wherein each of the sequence of sampled values corresponds to a different phase offset of the sequence of phase offsets.

21. The method of claim 19, wherein providing the sequence of phase offsets comprises:
applying the sequence of phase offsets to the RF oscillator signal to generate the RF reference signal having the sequence of phase offsets with respect to the RF oscillator signal.

22. The method of claim 19, wherein the RF channel is an RF transmitter channel and the output node is configured to be coupled to a transmit antenna, and
wherein the method further comprises:
coupling out a portion of the RF output signal to generate the RF test signal.

23. A circuit, comprising:
a radio frequency (RF) channel including an input node and an output node and being configured to receive an RF oscillator signal at the input node and to provide an RF output signal at the output node;
a monitor circuit including a mixer configured to mix an RF reference signal and an RF test signal that represents the RF output signal to generate a mixer output signal;
an analog-to-digital converter configured to sample the mixer output signal at a plurality of sampling times in order to generate a sequence of sampled values, wherein each sampled value of the sequence of sampled values corresponds to a respective phase offset of a sequence of phase offsets; and
a control circuit coupled to the analog-to-digital converter and configured to:
generate the sequence of phase offsets corresponding to the plurality of sampling times by repeatedly phase-shifting at least one of the RF test signal or the RF reference signal using one or more phase shifters such that a phase offset between the RF test signal and the RF reference signal is successively increased according to the sequence of phase offsets, calculate a spectral value from the sequence of sampled values, and calculate estimated phase information indicating a phase of the RF output signal based on the spectral value.

24. The circuit of claim 23, wherein the RF channel is an RF transmitter channel and the output node is configured to be coupled to a transmit antenna, and wherein the monitor circuit includes a coupler coupled to the RF transmitter channel and configured to couple out a portion of the RF output signal to generate the RF test signal.

\* \* \* \* \*